(12) United States Patent
Kurita et al.

(10) Patent No.: US 11,605,661 B2
(45) Date of Patent: Mar. 14, 2023

(54) IMAGE PROCESSING APPARATUS, IMAGE PROCESSING METHOD, AND SOLID-STATE IMAGING APPARATUS TO DETECT POLARIZATION PROPERTIES OF EACH COLOR

(71) Applicant: SONY CORPORATION, Tokyo (JP)

(72) Inventors: Teppei Kurita, Tokyo (JP); Ying Lu, Kanagawa (JP); Yuhi Kondo, Tokyo (JP); Yasutaka Hirasawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 147 days.

(21) Appl. No.: 16/763,543

(22) PCT Filed: Sep. 18, 2018

(86) PCT No.: PCT/JP2018/034389
§ 371 (c)(1),
(2) Date: May 12, 2020

(87) PCT Pub. No.: WO2019/102698
PCT Pub. Date: May 31, 2019

(65) Prior Publication Data
US 2020/0350353 A1   Nov. 5, 2020

(30) Foreign Application Priority Data
Nov. 21, 2017   (JP) .............................. JP2017-223423

(51) Int. Cl.
*H01L 27/146* (2006.01)
*H04N 5/369* (2011.01)
*H04N 9/04* (2006.01)

(52) U.S. Cl.
CPC ....... *H01L 27/14625* (2013.01); *H04N 5/369* (2013.01); *H04N 5/3696* (2013.01); *H04N 9/04551* (2018.08); *H04N 9/04557* (2018.08)

(58) Field of Classification Search
CPC ............ H01L 27/14625; H04N 5/3696; H04N 9/04551; H04N 9/04557; H04N 5/369; G02B 5/30; G02B 27/28
See application file for complete search history.

(56) References Cited

U.S. PATENT DOCUMENTS

| 4,833,525 A | 5/1989 | Suzuki et al. |
| 5,090,807 A * | 2/1992 | Tai .......................... G01J 3/12 |
| | | 356/330 |

(Continued)

FOREIGN PATENT DOCUMENTS

| CN | 101252139 A | 8/2008 |
| CN | 101887900 A | 11/2010 |

(Continued)

OTHER PUBLICATIONS

Office Action for CN Patent Application No. 201880073836.0, dated Sep. 3, 2021, 15 pages of Office Action and 26 pages of English Translation.

(Continued)

*Primary Examiner* — Jennifer D Bennett
*Assistant Examiner* — Erin R Garber
(74) *Attorney, Agent, or Firm* — Chip Law Group

(57) ABSTRACT

An unpolarized component image generating section generates unpolarized component image signals of specific and non-specific colors. A polarized component image generating section generates polarized component image signals of the specific and non-specific colors. A specific color polarization property detecting section detects polarization properties of the specific color using pixel signals of polarized or unpolarized pixels of the specific color having at least three polarization directions and pixel signals of polarized pixels having two polarization directions. An unpolarized color polarization property detecting section detects polarization properties of the non-specific color on the basis of the (Continued)

polarization properties of the specific color detected by the specific color polarization property detecting section, the pixel signals of the unpolarized pixels of the non-specific color, and the pixel signals of the polarized pixels of the non-specific color having fewer polarization directions than the polarized pixels of the specific color.

18 Claims, 30 Drawing Sheets

(56) References Cited

U.S. PATENT DOCUMENTS

| | | | | |
|---|---|---|---|---|
| 2010/0282945 | A1* | 11/2010 | Yokogawa | H04N 9/04555 250/225 |
| 2013/0050570 | A1 | 2/2013 | Ishigaki et al. | |
| 2013/0215285 | A1* | 8/2013 | Okuyama | H04N 5/2254 348/340 |
| 2016/0163752 | A1* | 6/2016 | Sambongi | G06V 10/42 348/222.1 |
| 2017/0230567 | A1* | 8/2017 | Takao | H04N 5/217 |
| 2018/0013988 | A1* | 1/2018 | Kondo | G02B 5/3025 |
| 2018/0308217 | A1 | 10/2018 | Kurita et al. | |

FOREIGN PATENT DOCUMENTS

| | | |
|---|---|---|
| CN | 107251553 A | 10/2017 |
| CN | 108293093 A | 7/2018 |
| EP | 2252069 A2 | 11/2010 |
| EP | 3264754 A1 | 1/2018 |
| JP | 2010-166580 A | 7/2010 |
| JP | 2010-263158 A | 11/2010 |
| JP | 2013-066166 A | 4/2013 |
| JP | 2010-263158 A | 11/2018 |
| KR | 10-2010-0122058 A | 11/2010 |
| WO | 2016/136085 A1 | 9/2016 |
| WO | WO-2016136085 A1 * | 9/2016 ............ G01B 11/24 |
| WO | 2017/081925 A1 | 5/2017 |
| WO | 2017/085993 A1 | 5/2017 |

OTHER PUBLICATIONS

International Search Report and Written Opinion of PCT Application No. PCT/JP2018/034389, dated Nov. 13, 2018, 11 pages of ISRWO.

* cited by examiner

F I G . 1
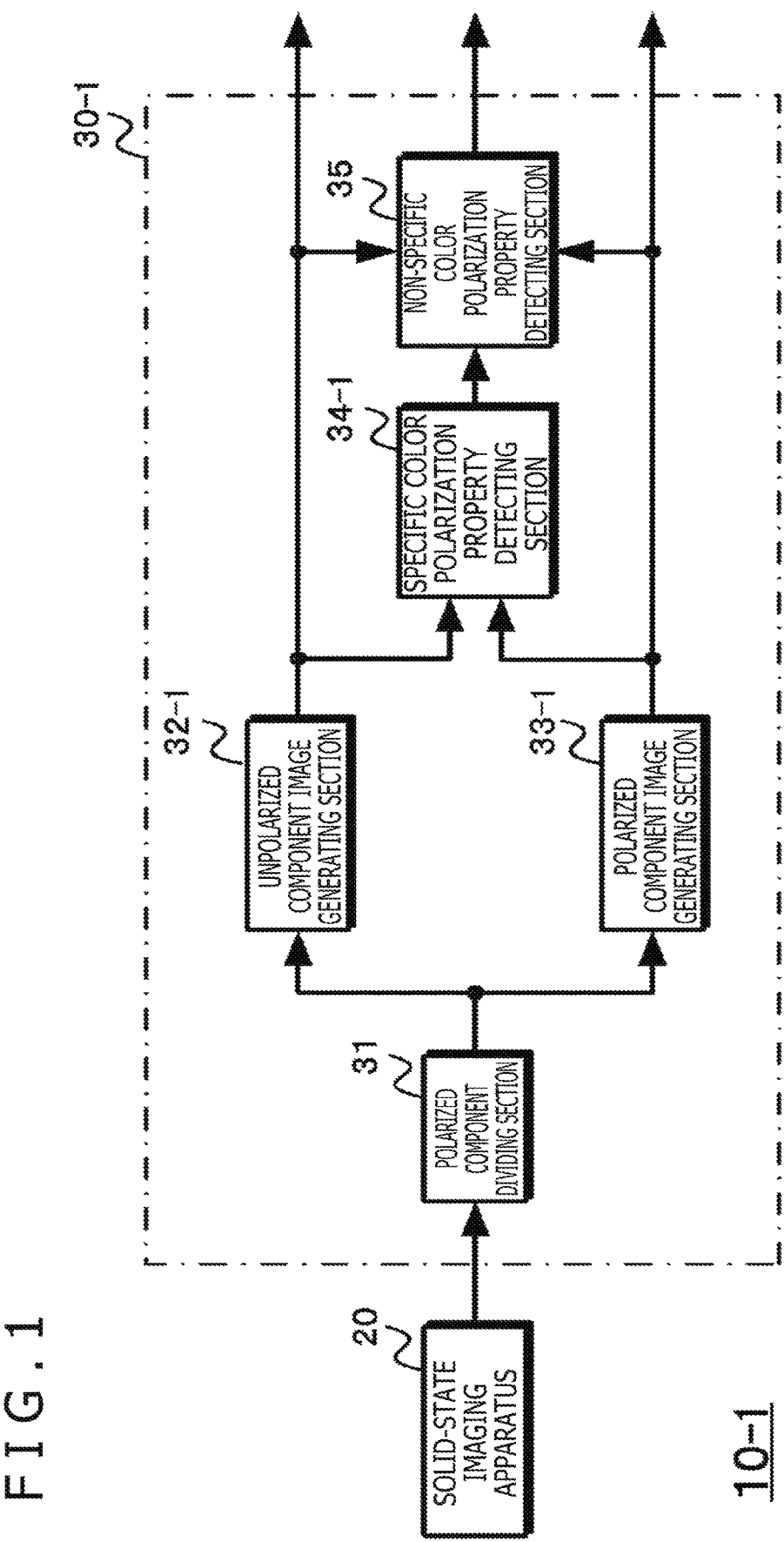

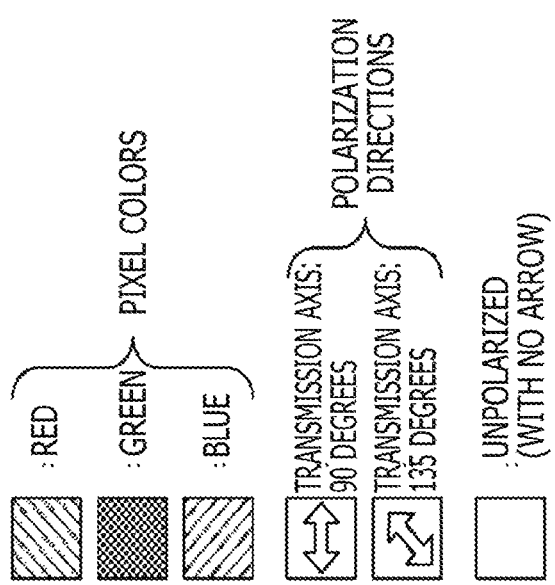
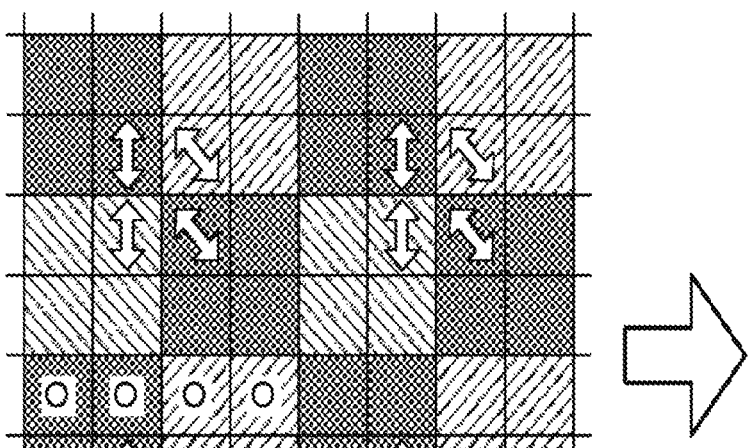
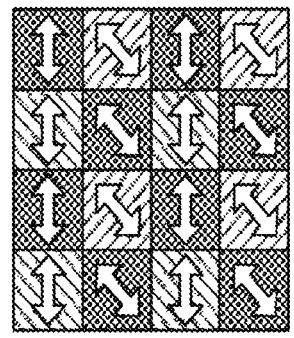
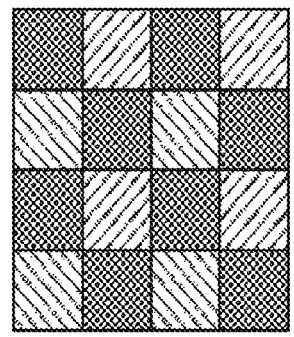
FIG. 4A
FIG. 4B
FIG. 4C

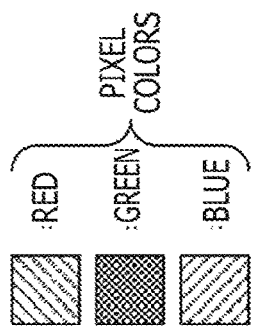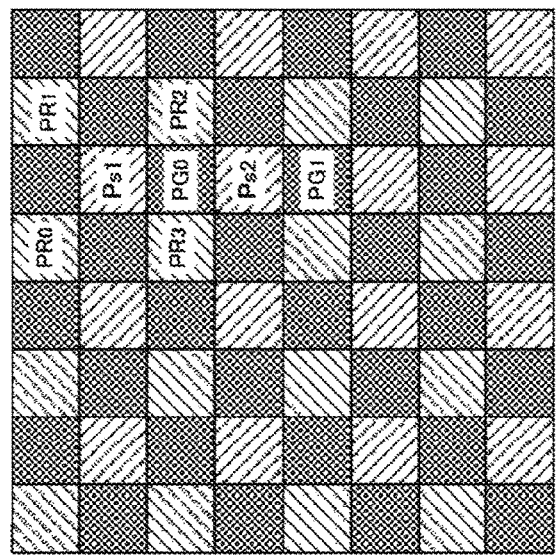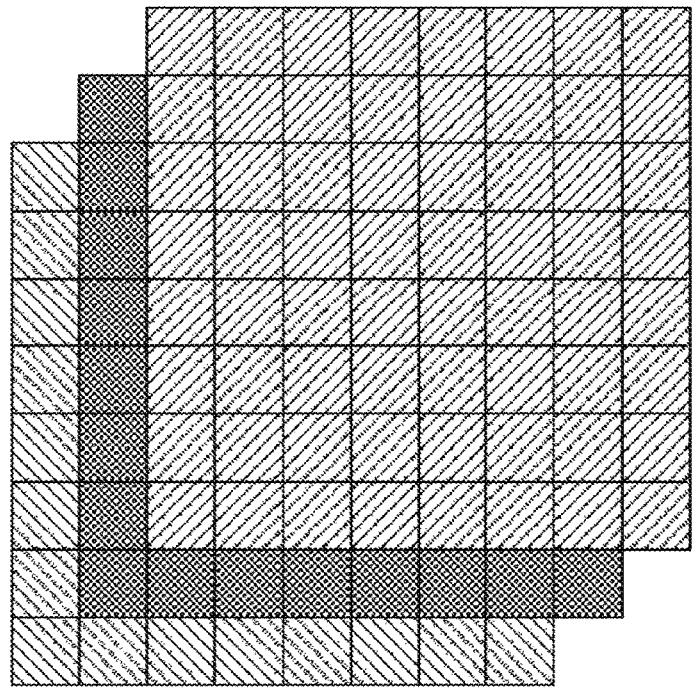
FIG. 5A
FIG. 5B

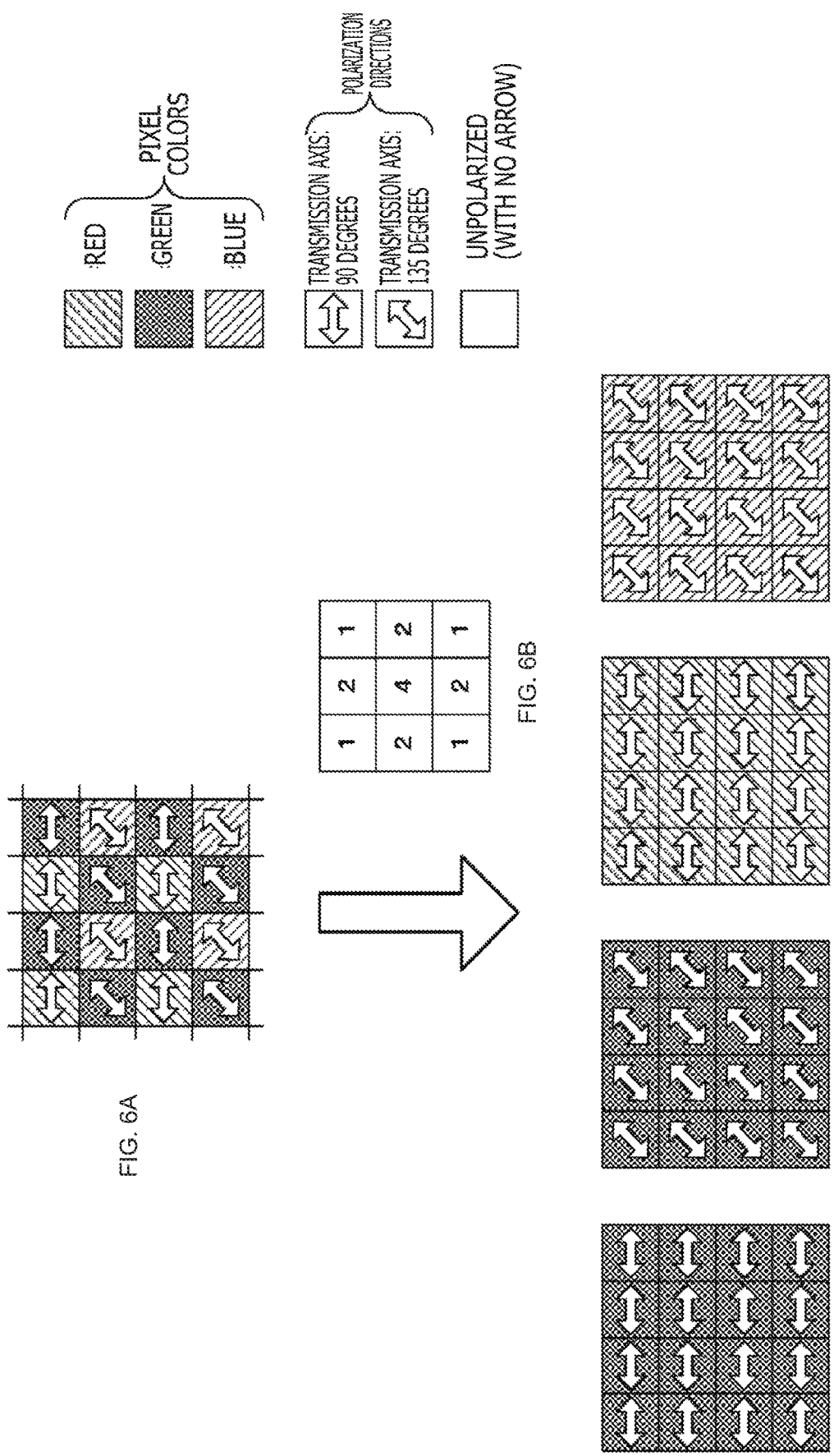

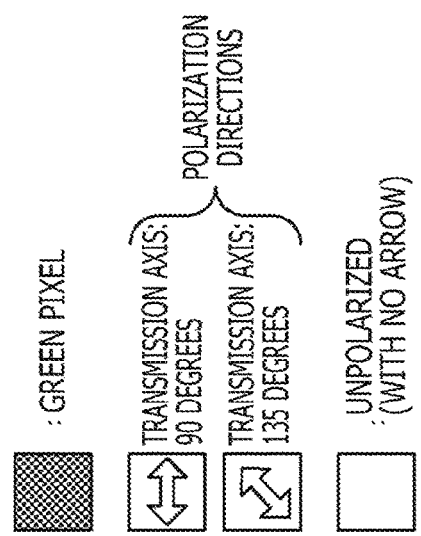
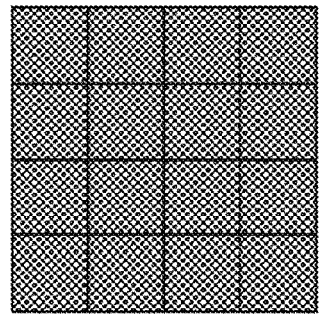
FIG. 7A
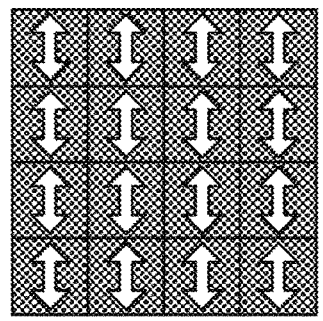
FIG. 7B
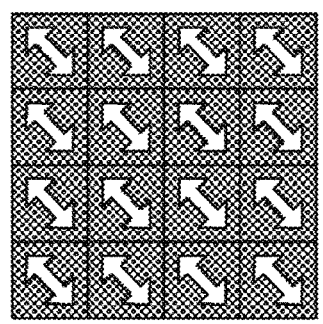
FIG. 7C

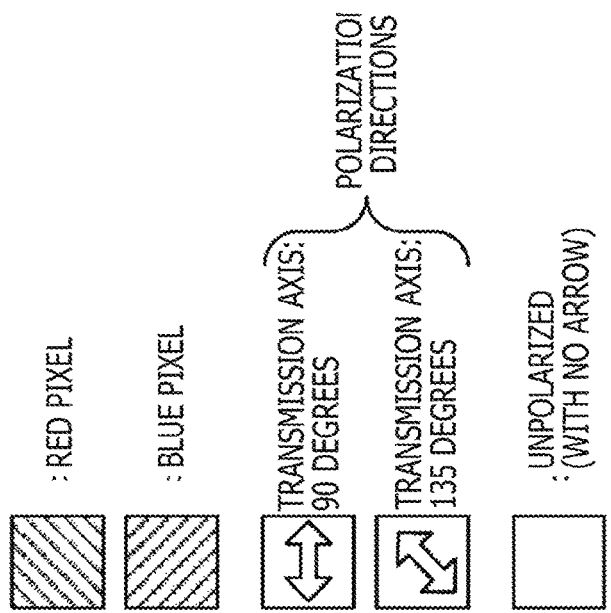
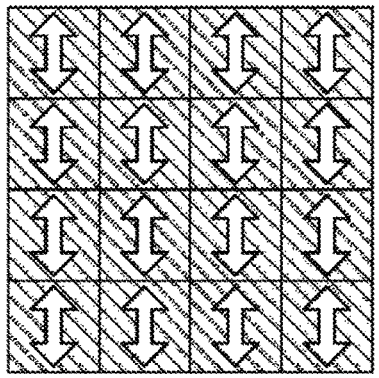
FIG. 8A
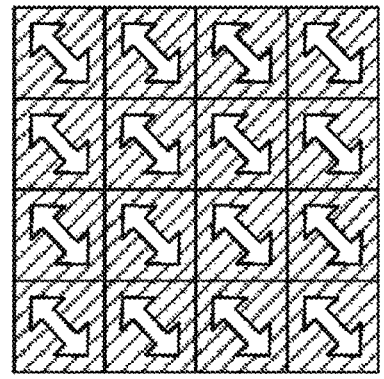
FIG. 8B
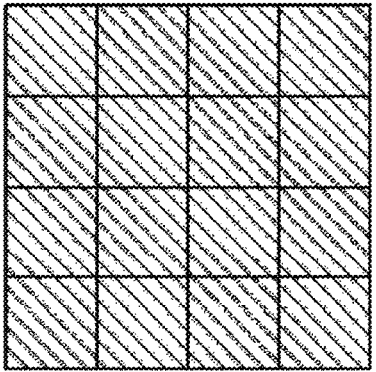
FIG. 8C
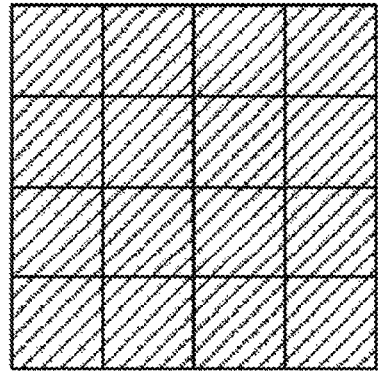
FIG. 8D

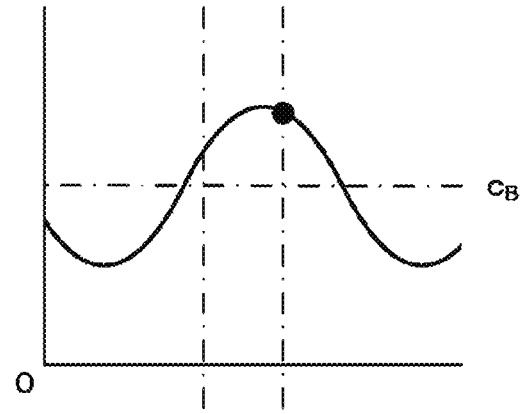
FIG. 9C BLUE PIXEL VALUE
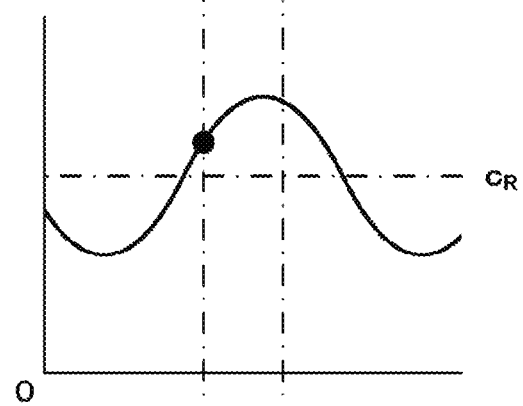
FIG. 9B RED PIXEL VALUE
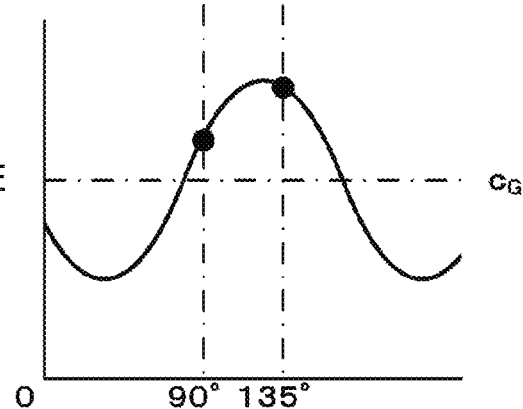
FIG. 9A GREEN PIXEL VALUE
POLARIZATION DIRECTIONS
(ANGLES OF TRANSMISSION AXES)

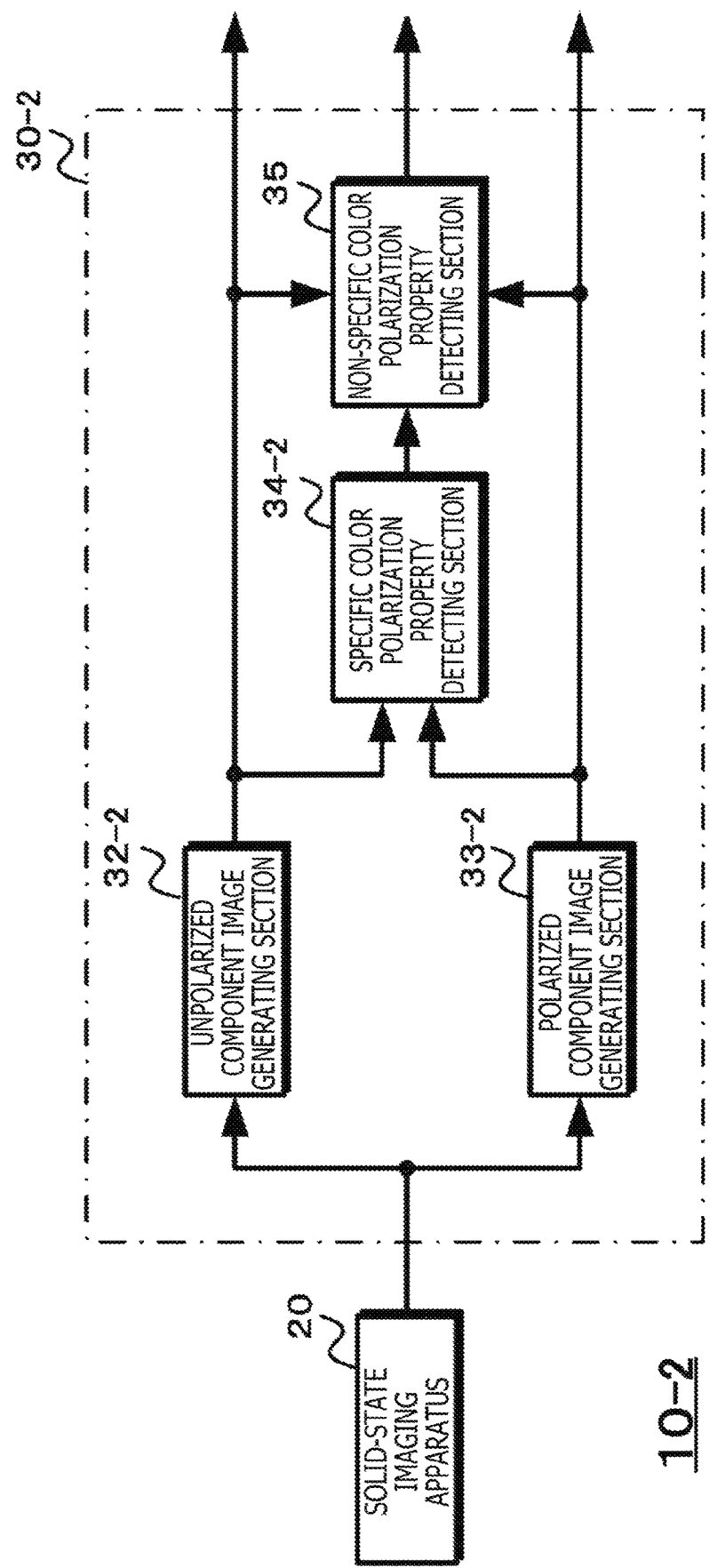

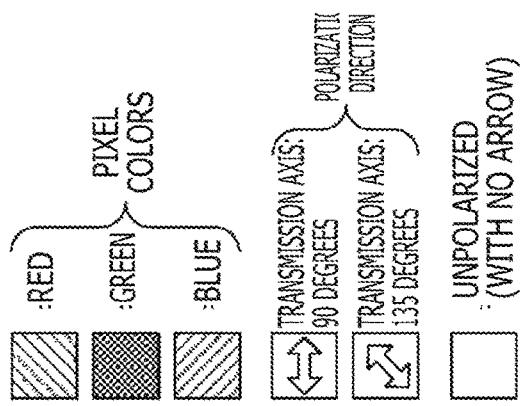
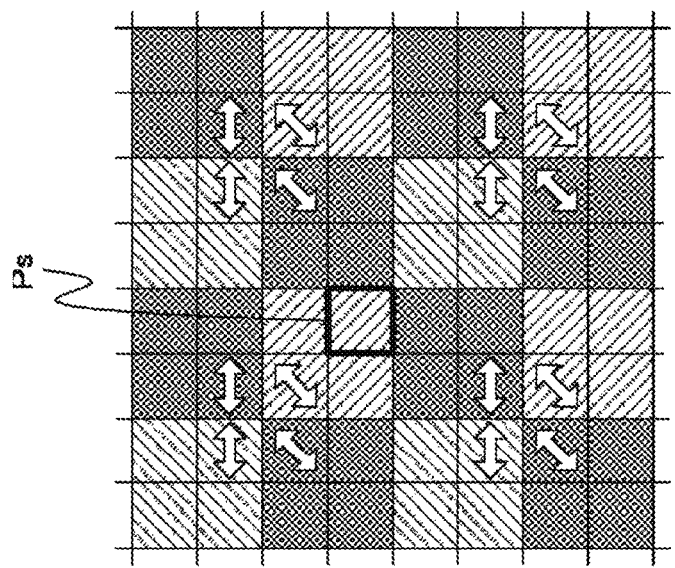
FIG. 12B
FIG. 12A

FIG. 15
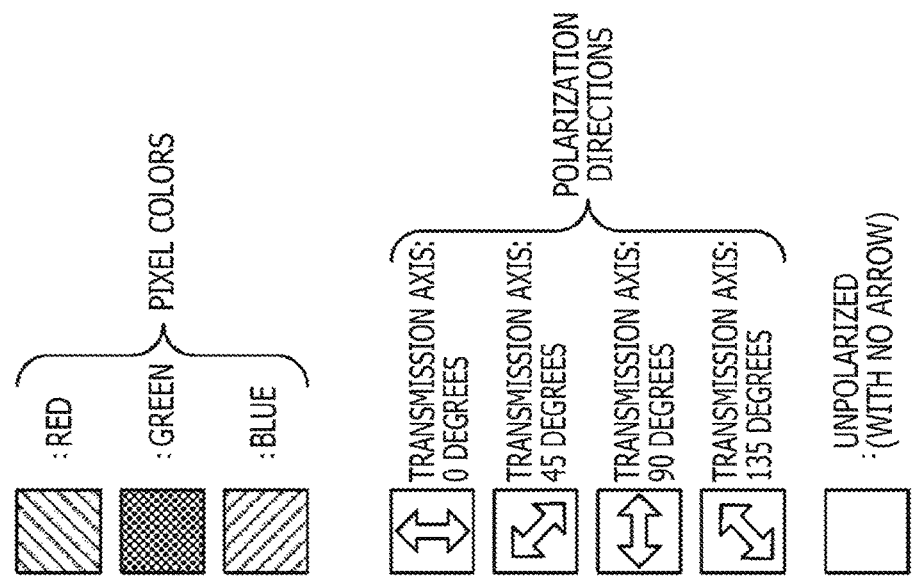
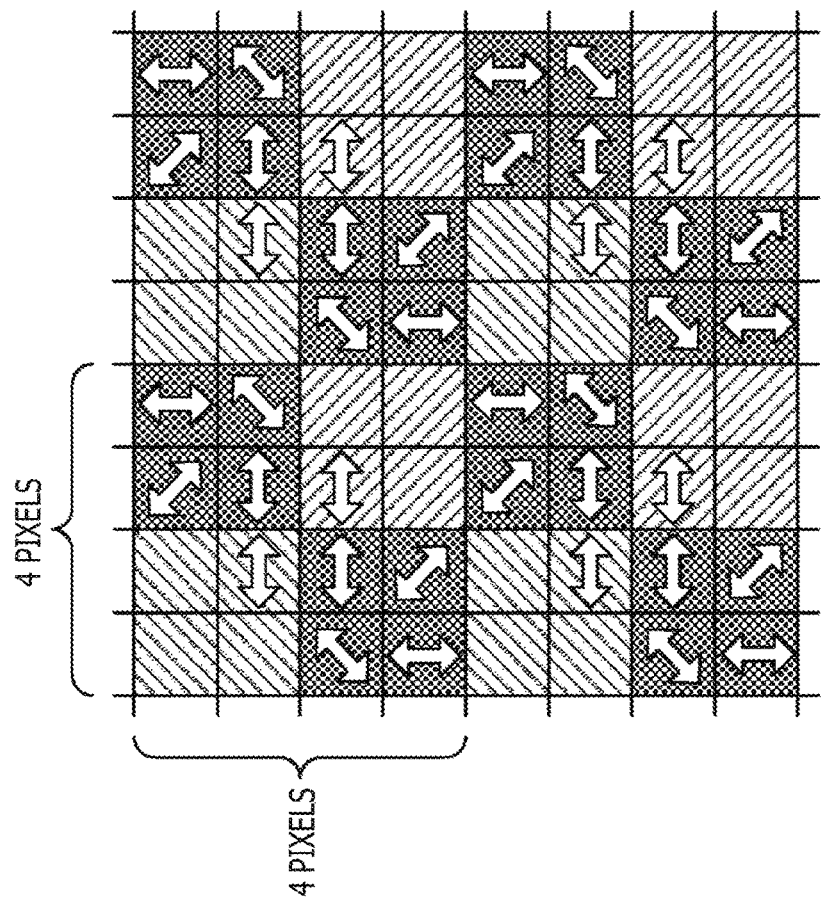

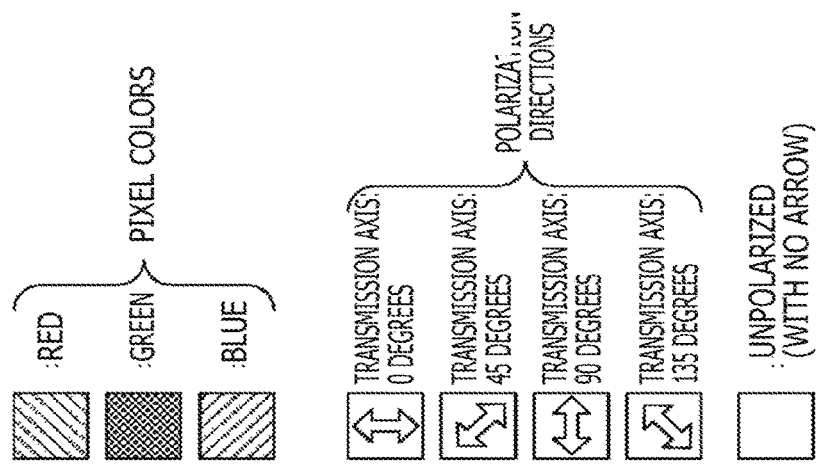
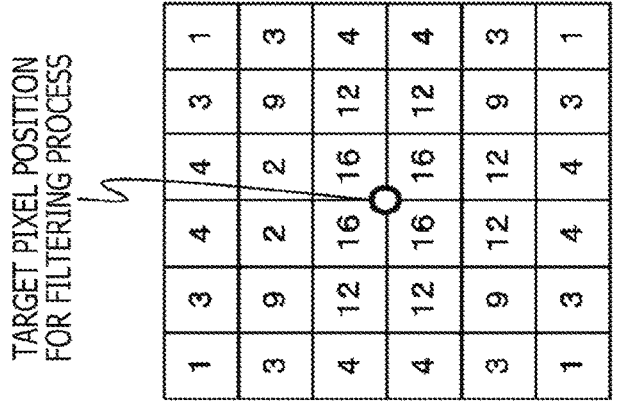
FIG. 16B
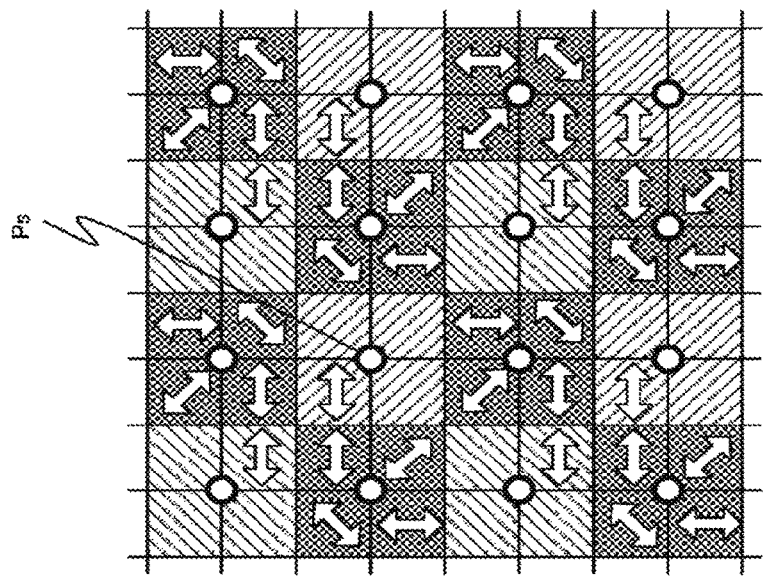
FIG. 16A

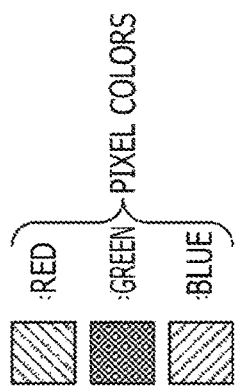
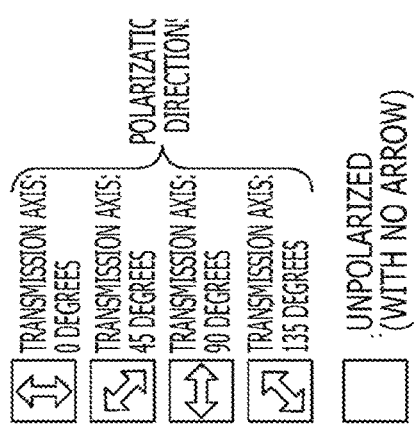
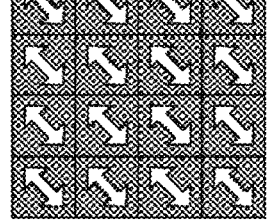
FIG. 17F
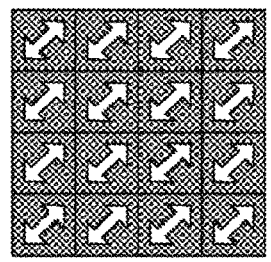
FIG. 17E
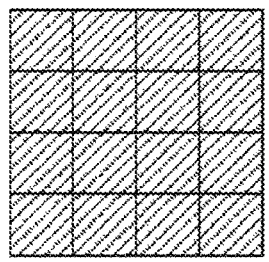
FIG. 17B
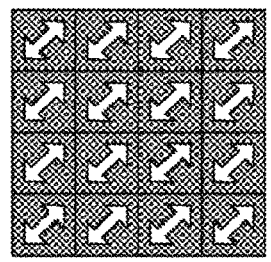
FIG. 17D
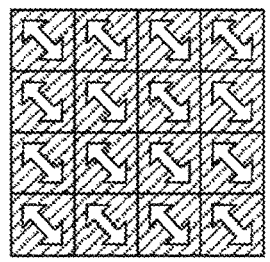
FIG. 17H
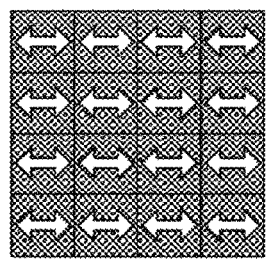
FIG. 17A
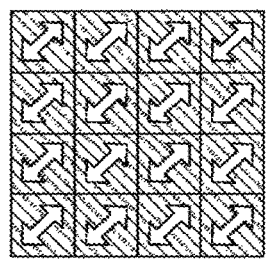
FIG. 17C
FIG. 17G

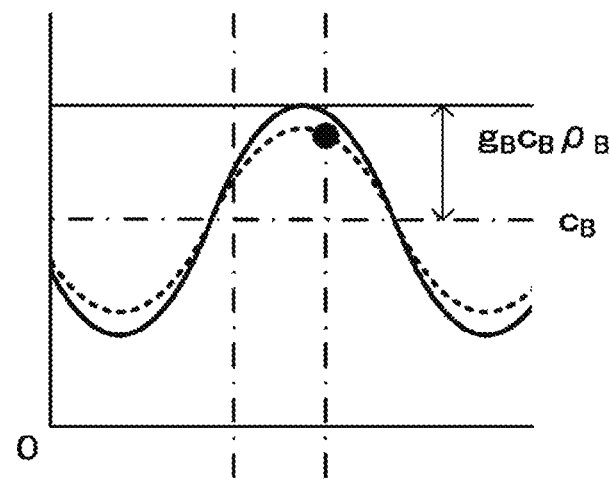
FIG. 19C  BLUE PIXEL VALUE
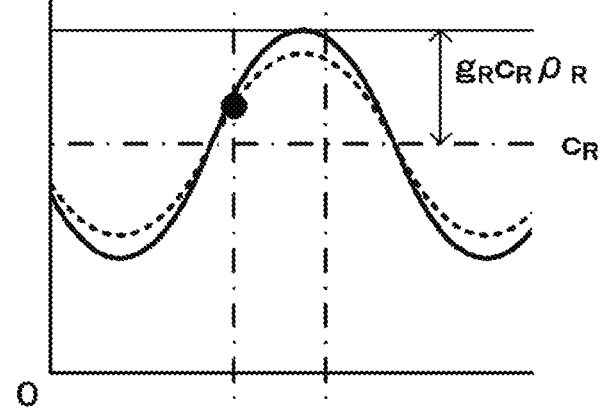
FIG. 19B  RED PIXEL VALUE
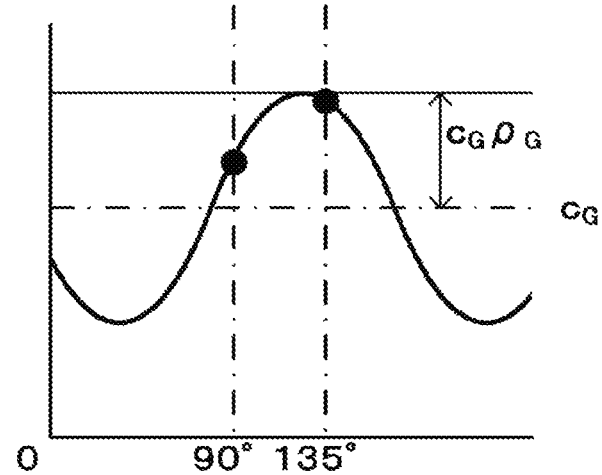
FIG. 19A  GREEN PIXEL VALUE
POLARIZATION DIRECTIONS
(ANGLES OF TRANSMISSION AXES)

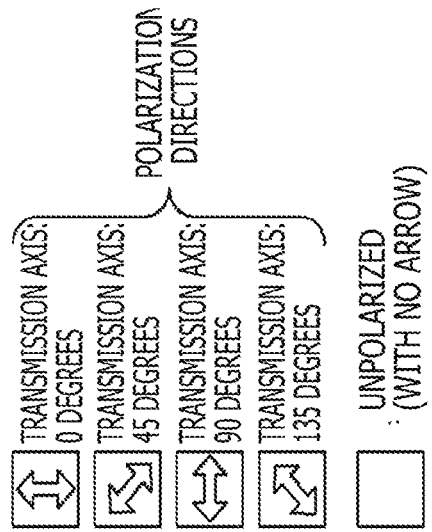
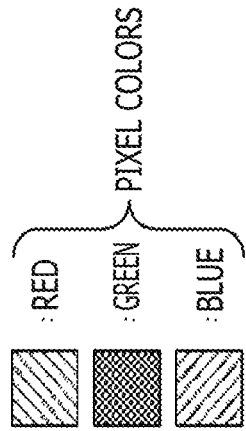
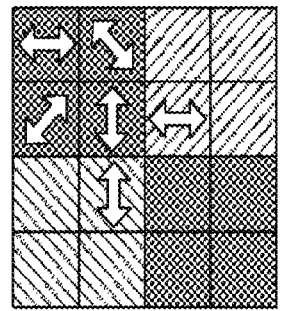
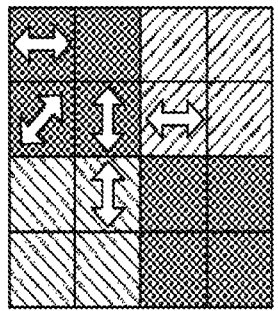
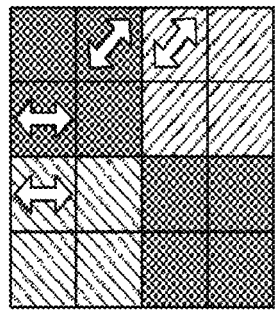
FIG. 23A  FIG. 23B  FIG. 23C
FIG. 23D  FIG. 23E  FIG. 23F

FIG.24
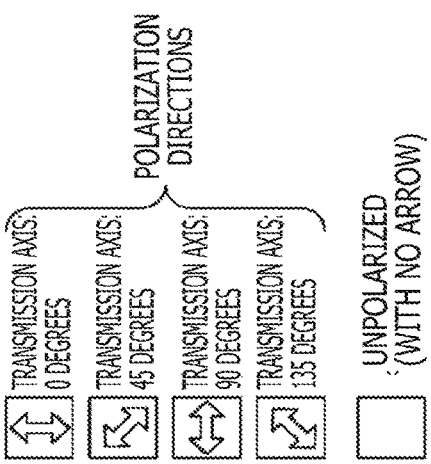
PIXEL COLORS: RED, GREEN, BLUE, WHITE
POLARIZATION DIRECTIONS: TRANSMISSION AXIS 0 DEGREES, TRANSMISSION AXIS 45 DEGREES, TRANSMISSION AXIS 90 DEGREES, TRANSMISSION AXIS 135 DEGREES, UNPOLARIZED (WITH NO ARROW)
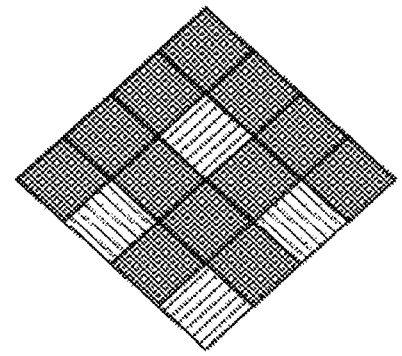
FIG.24E
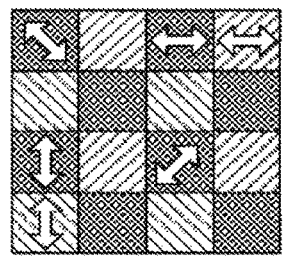
FIG.24B
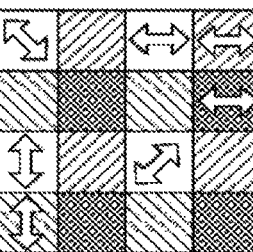
FIG.24D
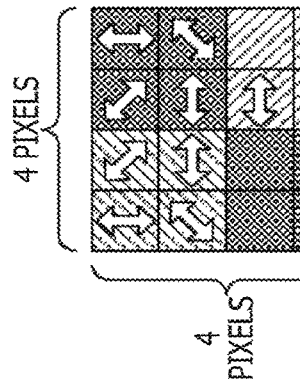
FIG.24A — 4 PIXELS × 4 PIXELS
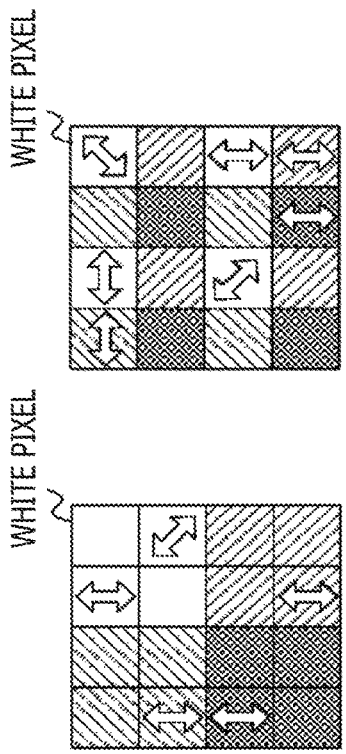
FIG.24C
WHITE PIXEL FIG. 27
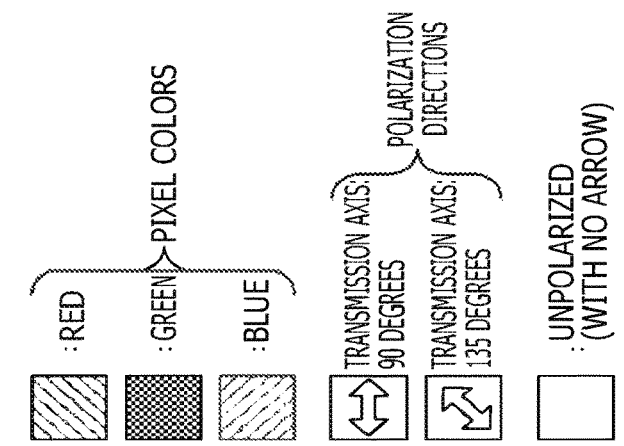
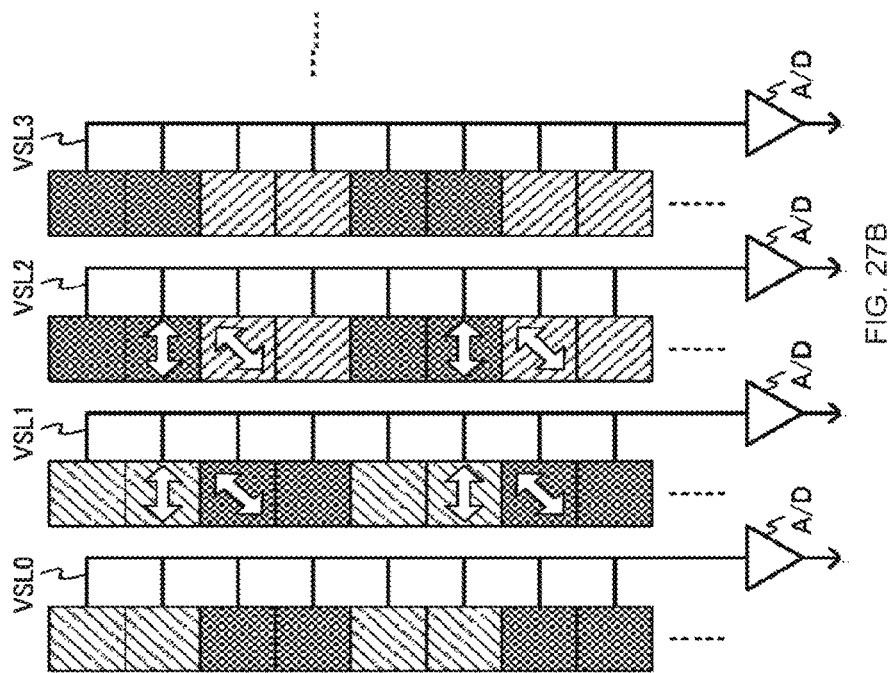
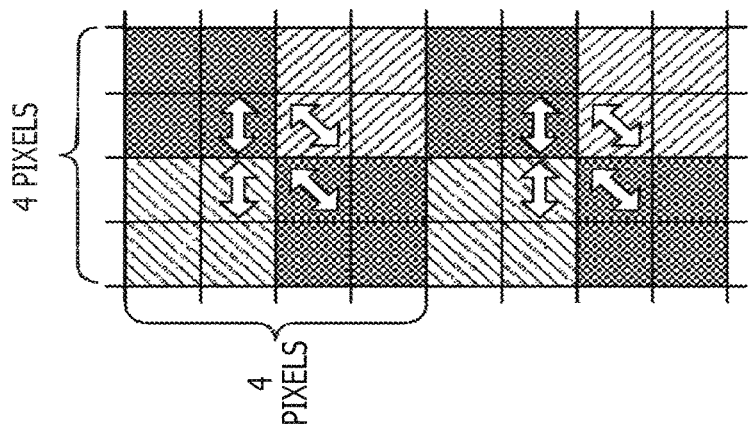
FIG. 27A
FIG. 27B FIG. 28
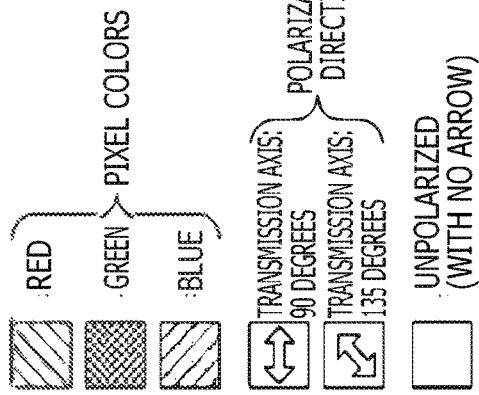
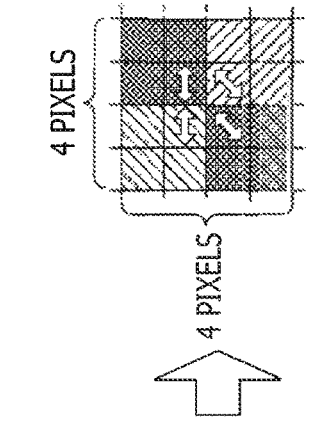
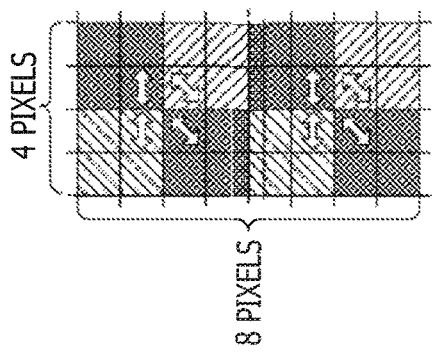
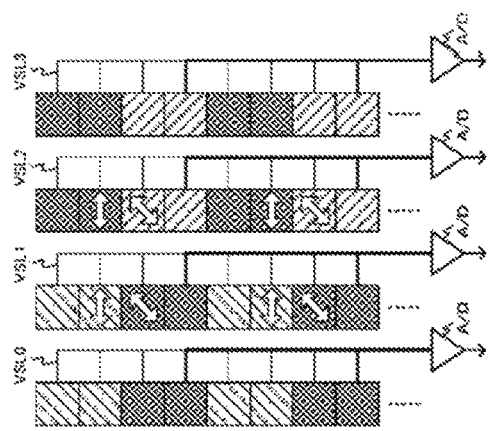
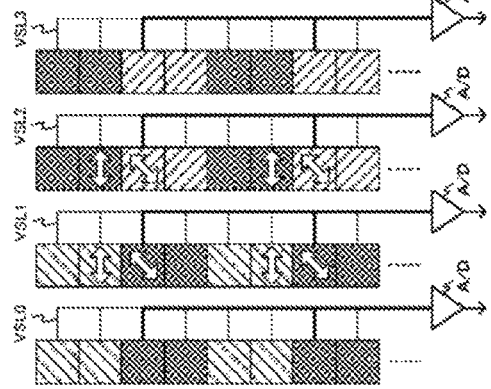
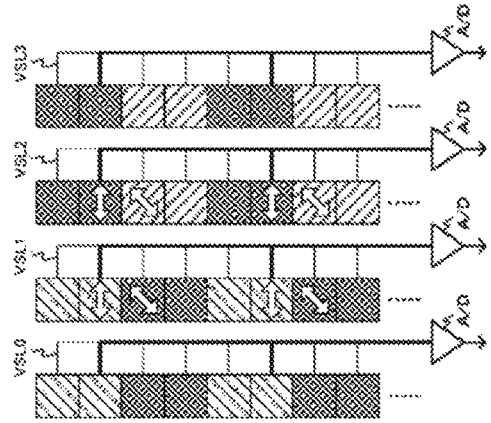
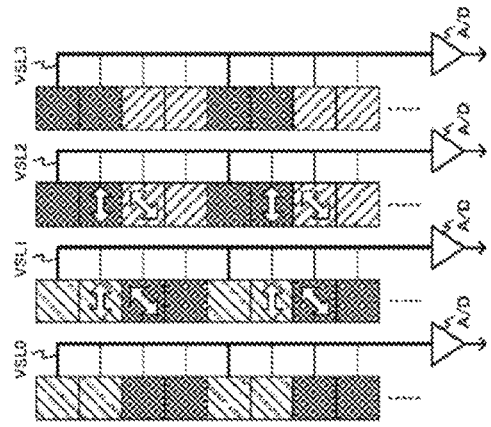

IMAGE PROCESSING APPARATUS, IMAGE PROCESSING METHOD, AND SOLID-STATE IMAGING APPARATUS TO DETECT POLARIZATION PROPERTIES OF EACH COLOR

CROSS REFERENCE TO RELATED APPLICATIONS

This application is a U.S. National Phase of International Patent Application No. PCT/JP2018/034389 filed on Sep. 18, 2018, which claims priority benefit of Japanese Patent Application No. JP 2017-223423 filed in the Japan Patent Office on Nov. 21, 2017. Each of the above-referenced applications is hereby incorporated herein by reference in its entirety.

TECHNICAL FIELD

This technology relates to an image processing apparatus, an image processing method, a program, and a solid-state imaging apparatus adapted to obtain output images of good image quality and to acquire polarization properties of each color.

BACKGROUND ART

Heretofore, imaged images and polarized images of a given subject have been acquired simultaneously. For example, PTL 1 states that, of the pixels each having a different color component, those pixels having a single specific color component are provided with polarizers serving as transmission axes of at least three different angles so as to acquire polarization properties from values of the pixels of the single specific color component, and that the pixel values of each color component are used for interpolation in acquiring an imaged image of each color component. PTL 1 further states that, in calculating color luminance specular reflection components, the specular reflection components of color components different from the single specific color component are calculated on the assumption that the specular reflection components of the different color components are equal to the specular reflection component of the single specific color component in terms of the degree of polarization.

CITATION LIST

Patent Literature

[PTL 1]
Japanese Patent Laid-open No. 2010-166580

SUMMARY

Technical Problem

Whereas PTL 1 assumes that the degree of polarization is the same for each color, it is difficult to calculate the specular reflection components highly accurately in the case where the degree of polarization varies from one color to another.

It is therefore an object of this technology to provide an image processing apparatus, an image processing method, a program, and a solid-state imaging apparatus for detecting the polarization properties of each color.

Solution to Problem

According to a first aspect of this technology, there is provided an image processing apparatus including a non-specific color polarization property detecting section configured to detect polarization properties of a non-specific color on the basis of polarization properties of a specific color, pixel signals of unpolarized pixels of the non-specific color different from the specific color, and pixel signals of polarized pixels of the non-specific color having fewer polarization directions than polarized pixels of the specific color.

The image processing apparatus of this technology generates an unpolarized component image signal of the specific color using the pixel signals of the unpolarized pixels, and an unpolarized component image signal of the non-specific color using the pixel signals of the unpolarized pixels of the non-specific color. The image processing apparatus further generates a polarized component image signal of the specific color using the pixel signals of the polarized pixels of the specific color, and a polarized component image signal of the non-specific color using the pixel signals of the polarized pixels of the non-specific color. The unpolarized component image signal and the polarized component image signal for each color are generated by performing a filtering process using pixel signals of pixels having the same color and the same polarization direction. A pixel signal of a target pixel position is calculated for each color and for each polarization direction, on the basis of a low-frequency component and a high-frequency component of the target pixel position, the low-frequency component of the pixel target position being calculated for each color and for each polarization direction by performing the filtering process using pixels surrounding the target pixel position and having the same color and the same polarization direction as the pixel of the target pixel position, for example, the high-frequency component of the target pixel position being calculated using the pixel signal of the target pixel position and the low-frequency component of the target pixel position having the same color and the same polarization direction as the pixel of the target pixel position.

The image processing apparatus detects the polarization properties of the specific color, using the pixel signals of polarized or unpolarized pixels of the specific color having at least three polarization directions and the pixel signals of polarized pixels having two polarization directions, for example. The image processing apparatus further detects the polarization properties of the non-specific color on the basis of the polarization properties of the specific color, on the pixel signals of the unpolarized pixels of the non-specific color different from the specific color, and on the pixel signals of the polarized pixels of the non-specific color having fewer polarization directions than the polarized pixels of the specific color. For example, the image processing apparatus detects the polarization properties of the non-specific color by calculating the degree of polarization of the non-specific color on the assumption that an azimuth angle of the specific color is equal to an azimuth angle of the non-specific color and on the basis of the nonpolarized component image signal, the polarized component image signal, and the polarization properties of the specific color.

The image processing apparatus further calculates color balance factors on the basis of the polarization properties of the specific color and the non-specific color by assuming that specular reflection is white. Using the calculated color balance factors, the image processing apparatus performs white balance adjustment on either the unpolarized component image signal or the polarized component image signal. In addition, the image processing apparatus may preferably adjust the color balance factors on the basis of either an amount of difference between the color balance factors based on the polarization properties on one hand and the color balance factors based on color information for reproducing the color white of a white subject on the other hand, or an amount of specular reflection. The image processing apparatus may then perform the white balance adjustment using the adjusted color balance factors.

According to a second aspect of this technology, there is provided an image processing method including causing a non-specific color polarization property detecting section to detect polarization properties of a non-specific color on the basis of polarization properties of a specific color, pixel signals of unpolarized pixels of the non-specific color different from the specific color, and pixel signals of polarized pixels of the non-specific color having fewer polarization directions than polarized pixels of the specific color.

According to a third aspect of this technology, there is provided a program for causing a computer to execute a process on an image including polarized and unpolarized pixels, the process including detecting polarization properties of a non-specific color on the basis of polarization properties of a specific color, pixel signals of unpolarized pixels of the non-specific color different from the specific color, and pixel signals of polarized pixels of the non-specific color having fewer polarization directions than polarized pixels of the specific color.

Incidentally, the program of the present technology may be offered in a computer-readable format to a general-purpose computer capable of executing diverse program codes, using storage media such as optical disks, magnetic disks, or semiconductor memories, or via communication media such as networks. When provided with that program in a computer-readable manner, the computer performs the processes defined by the program.

According to a fourth aspect of this technology, there is provided a solid-state imaging apparatus including pixels of a specific color configured to permit detection of polarization properties, and pixels of a non-specific color constituted by unpolarized pixels and by polarized pixels having fewer polarization directions than polarized pixels of the specific color, the non-specific color being different from the specific color.

According to this technology, the polarization properties of the non-specific color are detected on the basis of the polarization properties of the specific color, the pixel signals of the unpolarized pixels of the non-specific color different from the specific color, and the pixel signals of the polarized pixels of the non-specific color having fewer polarization directions than the polarized pixels of the specific color. Thus, it is possible to detect the polarization properties of each color with high accuracy. It is to be noted, incidentally, that the advantageous effects stated in the present description are only examples and are not limitative of this technology. There may be additional advantageous effects derived from the present description.

BRIEF DESCRIPTION OF DRAWINGS

FIG. 1 is a view depicting an exemplary configuration of a first embodiment of this technology.

FIGS. 4A, 4B, and 4C are views depicting an image yet to be divided by component and an image divided.

FIGS. 5A and 5B are views for explaining the operations of an unpolarized component image generating section 32-1.

FIGS. 6A, 5B, 6C, 6D, 6E, and 6F are views for explaining the operations of a polarized component image generating section 33-1.

FIGS. 7A, 7B, and 7C are views depicting green component images.

FIGS. 8A, 8B, 87C, and 8D are views depicting red component images and blue component images.

FIGS. 9A, 9B, and 9C are views depicting exemplary polarization properties (polarization models).

FIG. 11 is a view depicting an exemplary configuration of a second embodiment of this technology.

FIGS. 12A and 12B are views for explaining the operations of an unpolarized component image generating section 32-2.

FIG. 15 is a view depicting an exemplary pixel array of the solid-state imaging apparatus.

FIGS. 16A and 16B are views for explaining the operations of an unpolarized component image generating section 32-3.

FIGS. 17A, 17B, 17C, 17D, 17E, 17F, 17G and 17H are views depicting unpolarized component images and polarized component images.

FIGS. 19A, 19B, and 19C are views for explaining color balance factors.

FIGS. 23A, 23B, 23C, 23D, 23E, and 23F are views depicting exemplary partial pixel arrays (part 1).

FIGS. 24A, 24B, 24C, 24D, and 24E are views depicting exemplary partial pixel arrays (part 2).

FIGS. 27A, and 27B are views depicting pixels and readout signal lines of the solid-state imaging apparatus.

FIGS. 28A, 28B, 28C, 28D, 28E, and 28F are views for explaining the operations of reading out pixel signals.

DESCRIPTION OF EMBODIMENTS

Figure 2:
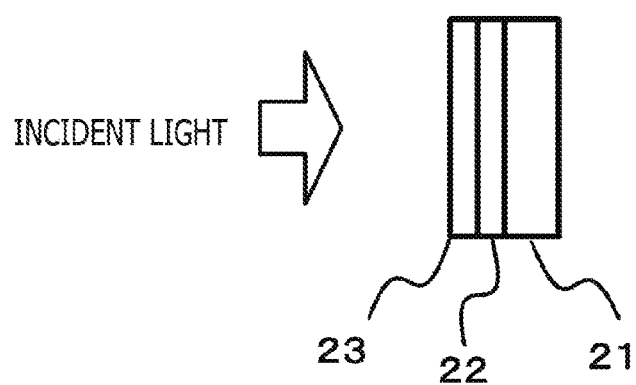
FIG. 2 is a view depicting a partial configuration of a solid-state imaging apparatus.

The embodiments for implementing the present technology are described below. Note that the description will be given in the following order.

1. First Embodiment
1-1. Configuration of the first embodiment
1-2. Specific examples and operations of the first embodiment
2. Second Embodiment
2-1. Configuration of the second embodiment
2-2. Specific examples and operations of the second embodiment
3. Third Embodiment
3-1. Configuration of the third embodiment
3-2. Specific examples and operations of the third embodiment
4. Fourth Embodiment
4-1. Configuration of the fourth embodiment
4-2. Specific examples and operations of the fourth embodiment
5. Fifth Embodiment
5-1. Configuration of the fifth embodiment
5-2. Specific examples and operations of the fifth embodiment
6. Other embodiments
7. Other configurations of the solid-state imaging apparatus
7-1. Pixel arrays
7-2. Signal readout
8. Usage examples 1. First Embodiment 1-1. Configuration of the First Embodiment FIG. 1 depicts an exemplary configuration of a first embodiment of this technology. An imaging system 10-1 includes a solid-state imaging apparatus 20 and an image processing apparatus 30-1. The image processing apparatus 30-1 includes a polarized component dividing section 31, an unpolarized component image generating section 32-1, a polarized component image generating section 33-1, a specific color polarization property detecting section 34-1, and a non-specific color polarization property detecting section 35.

The solid-state imaging apparatus 20 has pixels of a specific color configured to permit detection of polarization properties, and pixels of non-specific colors different from the specific color and constituted by unpolarized pixels and by the polarized pixels having fewer polarization directions than the pixels of the specific color. The solid-state imaging apparatus 20 performs analog-to-digital conversion (A/D conversion) or the like on a pixel signal read out from each of the pixels to generate image signals of a polarized RAW image. The solid-state imaging apparatus 20 outputs the image signals to the image processing apparatus 30-1. The solid-state imaging apparatus 20 may also perform white balance adjustment on the image signals to be output to the image processing apparatus 30-1.

The polarized component dividing section 31 in the image processing apparatus 30-1 divides the image signals of the polarized RAW image supplied from the solid-state imaging apparatus 20 into signals of the unpolarized pixels and signals of the polarized pixels so as to generate unpolarized image signals and polarized image signals. The polarized component dividing section 31 outputs the unpolarized pixel signals to the unpolarized component image generating section 32-1 and the polarized image signals to the polarized component image generating section 33-1.

The unpolarized component image generating section 32-1 generates an unpolarized component image signal of a specific color using the signal of the specific color out of the unpolarized image signals, and an unpolarized component image signal of non-specific colors using the signals of the non-specific colors out of the unpolarized image signals. The unpolarized component image generating section 32-1 outputs the unpolarized component image signal of the specific color to the specific color polarization property detecting section 34-1 and the unpolarized component image signal of the non-specific colors to the non-specific color polarization property detecting section 35.

The polarized component image generating section 33-1 generates a polarized component image signal of the specific color using the signal of the specific color out of the polarized image signals, and a polarized component image signal of the non-specific colors using the signals of the non-specific colors out of the polarized image signals. The polarized component image generating section 33-1 outputs the polarized component image signal of the specific color to the specific color polarization property detecting section 34-1 and the polarized component image signal of the non-specific colors to the non-specific color polarization property detecting section 35.

The specific color polarization property detecting section 34-1 detects the polarization properties of the specific color on the basis of the unpolarized component image signal and polarized component image signal of the specific color. Further, the specific color polarization property detecting section 34-1 outputs the detected polarization properties of the specific color to the non-specific color polarization property detecting section 35.

The non-specific color polarization property detecting section 35 detects the polarization properties of the non-specific colors on the basis of the polarization properties of the specific color detected by the specific color polarization property detecting section 34-1, the pixel signals of the unpolarized pixels of the non-specific colors, and the pixel signals of the polarized pixels of the non-specific colors having fewer polarization directions than the polarized pixels of the specific color.

1-2. Specific Examples and Operations of the First Embodiment

FIG. 2 depicts a partial configuration of the solid-state imaging apparatus. The solid-state imaging apparatus 20 has a color mosaic filter 22 and a polarizer 23 disposed on the light incident plane of an image sensor 21. The image sensor 21 performs photoelectric conversion for each pixel on the incident light entered via the color mosaic filter 22 and the polarizer 23 to generate a pixel signal. The image sensor 21 further reads out the pixel signal from each pixel for analog-to-digital conversion or the like, generating an image signal of a polarized RAW image and outputting the image signal to the image processing apparatus 30-1. The color mosaic filter 22 has, for example, red, green, and blue color unit regions arranged in a Bayer array. Incidentally, the color unit regions are not limited to single-pixel regions and may be multiple-pixel regions (e.g., 2×2 pixel regions). The polarizer 23 is disposed to detect the polarization properties regarding the pixels of the specific color. For example, the polarizer 23 is configured using, for example, polarized or unpolarized pixels having at least three polarization directions and polarized pixels having two polarization directions. Further, the polarizer 23 is configured using unpolarized pixels of the non-specific colors and polarized pixels of the non-specific colors having one polarization direction.

Figure 3:
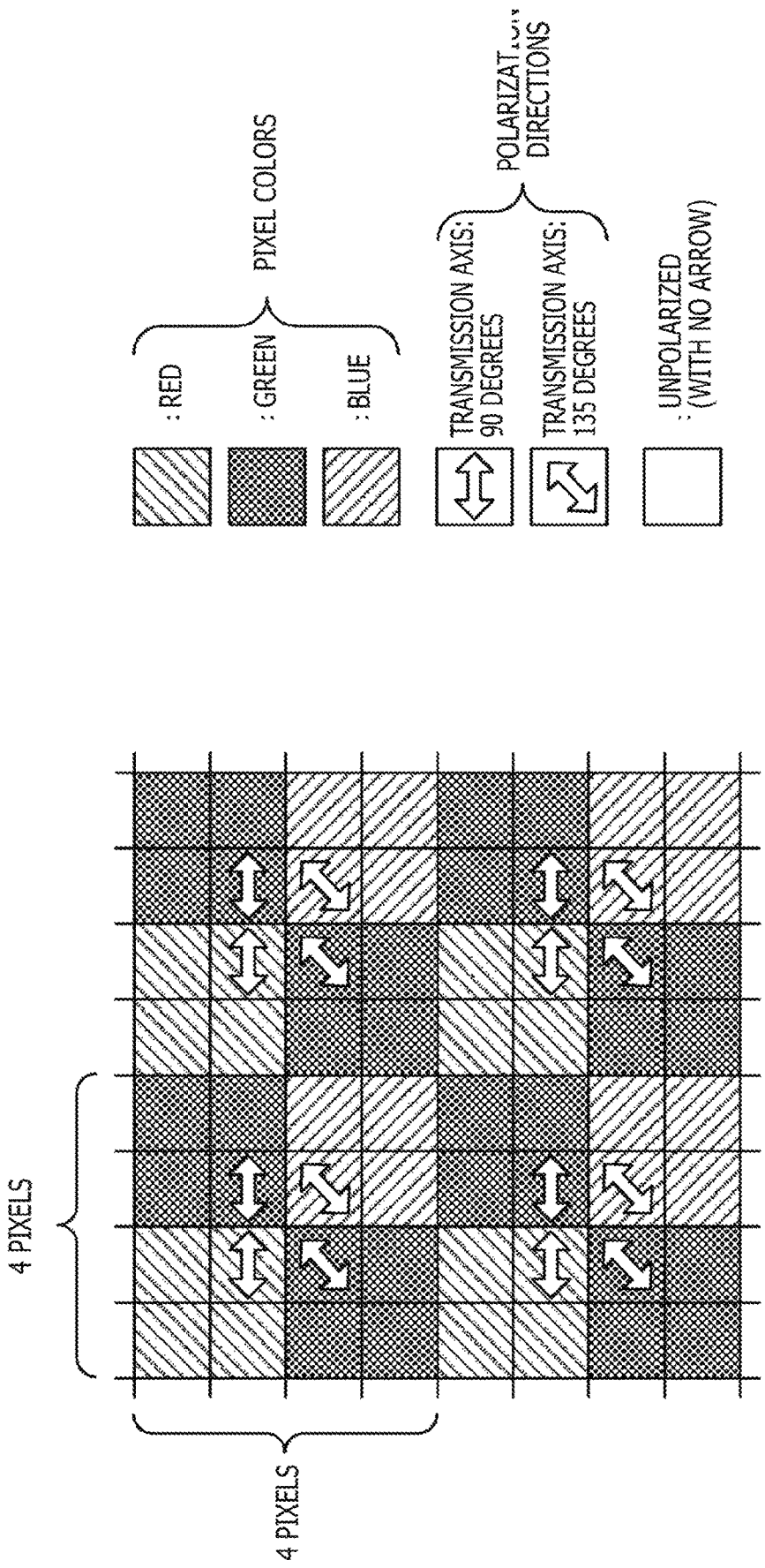
FIG. 3 is a view depicting a pixel array in which the specific color is green and the non-specific colors are red and blue.

FIG. 3 depicts a pixel array in which the specific color is green and the non-specific colors are red and blue. For example, 2×2 pixels constitute a color unit region, with 4×4 pixels forming a pixel array repeat unit in a Bayer array that includes red, green, and blue color unit regions. In addition, a polarized pixel is constituted by a 2×2 pixel region including two green pixels, one red pixel, and one blue pixel in the middle part of the pixel array repeat unit. The upper two pixels and the lower two pixels have different polarization directions. The upper two pixels have a transmission axis of 90 degrees and the lower two pixels have a transmission axis of 135 degrees, for example. That is, in the pixel array repeat unit, the green pixels, which have the specific color, are constituted by two polarized pixels having different polarization directions and six unpolarized pixels. The red and the blue pixels, which have the non-specific colors, are constituted by one polarized pixel and three unpolarized pixels.

The solid-state imaging apparatus 20 performs adjustments such as white balance adjustment on the pixel signals generated by the unpolarized and polarized pixels, and outputs the adjusted pixel signals to the image processing apparatus 30-1. White balance adjustment involves the use of color balance factors based on color information for reproducing the color white of a white subject. Specifically, expressions (1) to (3) given below are calculated using color balance factors (white balance gain) $g_R$, $g_G$, and $g_B$ set beforehand in keeping with the illumination light source in use. It is to be noted that in the expressions, DRs stands for a red pixel signal yet to undergo the white balance adjustment and DRw for a red pixel signal obtained after the white balance adjustment. Likewise, DGs and DBs denote a red pixel signal and a blue pixel signal respectively that are yet to undergo the white balance adjustment, and DGw and DBw represent a green pixel signal and a blue pixel signal respectively that are obtained after the white balance adjustment. Preferably, the white balance adjustment may be performed by the image processing apparatus 30-1.

$$DRw = g_R \times DRs \qquad (1)$$

$$DGw = g_G \times DGs \qquad (2)$$

$$DBw = g_B \times DBs \qquad (3)$$

The polarized component dividing section 31 in the image processing apparatus 30-1 divides the image signals of the polarized RAW image supplied from the solid-state imaging apparatus 20 into signals of the unpolarized pixels and signals of the polarized pixels so as to generate unpolarized image signals and polarized image signals. Further, the polarized component dividing section 31 equalizes the unpolarized image signals and the polarized image signals in terms of resolution (number of pixels). In the case where the solid-state imaging apparatus 20 is configured to have the pixel array depicted in FIG. 3, three unpolarized pixels are integrated into one pixel because the 2×2 pixel color unit region has one polarized pixel and three unpolarized pixels. For example, the pixel value of one pixel is calculated by averaging the pixel values of the three unpolarized images in the 2×2 pixel color unit region.

FIGS. 4A, 4B, and 4C depict an image yet to be divided by polarization component and an image divided. FIG. 4A depicts a polarized RAW image, FIG. 4B illustrates an unpolarized image, and FIG. 4C presents a polarized image. Given each 2×2 pixel color unit region in the polarized RAW image, the polarized component dividing section 31 integrates the unpolarized pixels indicated by circles into one unpolarized image pixel. Further, the polarized component dividing section 31 obtains one polarized image pixel by extracting the polarized pixel from each 2×2 pixel color unit region in the polarized RAW image. Thus, from the polarized RAW image, an unpolarized image and a polarized image in a Bayer array are obtained with half the resolution (number of pixels) in the vertical and horizontal directions. The polarized component dividing section 31 outputs the unpolarized image signals to the unpolarized component image generating section 32-1 and the polarized image signals to the polarized component image generating section 33-1.

Using the unpolarized image signals supplied from the polarized component dividing section 31, the unpolarized component image generating section 32-1 generates the unpolarized component image signal of each color. The unpolarized component image generating section 32-1 performs, for example, an interpolation process to calculate the pixel value of a target pixel position using the pixel values of pixels having the same color and positioned in the periphery of the target pixel position.

FIGS. 5A and 5B are views for explaining the operations of the unpolarized component image generating section 32-1. FIG. 5A depicts an unpolarized image. When calculating, for example, a pixel value DRs1 of the red component at a target pixel position Ps1, the unpolarized component image generating section 32-1 performs calculation by the expression (4) given below, using a pixel value DR0 of a red pixel PR0 and pixel values DR1 to DR3 of red pixels PR1 to PR3, the pixels being positioned in the periphery of the target pixel position. The unpolarized component image generating section 32-1 obtains an average of the pixel values of the red pixels positioned in the periphery of the target pixel position and considers the average to be the pixel value DRs1 of the red component at the target pixel position Ps1. In addition, when calculating, for example, a pixel value DGs2 of the green component at a target pixel position Ps2, the unpolarized component image generating section 32-1 performs calculation by the expression (5) given below, using a pixel value DG0 of a green pixel PG0 and a pixel value DG1 of a green pixel PG1, the pixels being positioned in the periphery of the target pixel position. The unpolarized component image generating section 32-1 obtains an average of the pixel values of the green pixels positioned in the periphery of the target pixel position and considers the average to be the pixel value DGs2 of the green component at the target pixel position Ps2.

$$DRs1 = (DR0 + DR1 + DR2 + DR3)/4 \qquad (4)$$

$$DGs2 = (DG0 + DR1)/2 \qquad (5)$$

Incidentally, the interpolation process is not limited to the method depicted in FIGS. 5A and 5B. For example, when calculating the pixel value DRs1 of the red component at the target pixel position Ps1, the unpolarized component image generating section 32-1 may perform the interpolation process, using two pixels of the red component opposed to each other across the target pixel position Ps1. Also, when calculating the pixel value DGs2 of the green component at the target pixel position Ps2, the unpolarized component image generating section 32-1 may perform the interpolation process, using four pixels of the green component adjacent to the target pixel position on the upper, lower, right, and left sides.

The unpolarized component image generating section 32-1 performs the interpolation process on each color, using the unpolarized image signals. By so doing, the unpolarized component image generating section 32-1 generates an unpolarized component image of each color with the same resolution (number of pixels) as that of the unpolarized image, as depicted in FIG. 5B. The unpolarized component image generating section 32-1 outputs the unpolarized component image signal of the specific color to the specific color polarization property detecting section 34-1 and the unpolarized component image signal of the non-specific colors to the non-specific color polarization property detecting section 35.

The polarized component image generating section 33-1 generates the polarized component image signal of each color using the polarized image signals supplied from the polarized component dividing section 31. In addition, given a color involving multiple polarization directions, the polarized component image generating section 33-1 generates the polarized component image signal for each polarization direction. The polarized component image generating section 33-1 performs, for example, a filtering process to calculate the pixel value of the target pixel position, using the pixel values of pixels having the same color and the same polarization direction and positioned in the periphery of the target pixel position. FIGS. 6A, 6B, 6C, 6D, 6E, and 6F are views for explaining the operations of the polarized component image generating section 33-1. FIG. 6A depicts a polarized image, and subfigure FIG. 6B indicates exemplary filter factors. In addition, given the polarized image, the polarized component image generating section 33-1 performs the filtering process on the pixel value of the target pixel position, using the pixel values of pixels having the same color and the same polarization direction and positioned in the periphery of the target pixel position. By so doing, the polarized component image generating section 33-1 generates the polarized image of each color in each polarization direction as depicted in FIGS. 6C, 6D, 6E, and 6F. The polarized component image generating section 33-1 outputs the polarized component image signal of the specific color in each polarization direction to the specific color polarization property detecting section 34-1 and the polarized component image signal of the non-specific colors to the non-specific color polarization property detecting section 35.

The specific color polarization property detecting section 34-1 detects the polarization properties of the specific color on the basis of the unpolarized component image signal of the specific color obtained by the unpolarized component image generating section 32-1 and the polarized component image signal of the specific color in each polarization direction acquired by the polarized component image generating section 33-1.

The polarization models indicative of polarization properties are known to be represented by the expression (6) given below. It is to be noted that in the expression (6), symbol "y" stands for an observed luminance (pixel value) at a polarization angle "x," and symbol "c" denotes a pixel value Ic of an unpolarized pixel as indicated by the expression (7) given below. In addition, symbols "a" and "b" represent parameter values calculated on the basis of the expressions (8) and (9) given below. Symbol "K" in the expressions (8) and (9) given below stands for the gain that absorbs the difference in sensitivity between unpolarized and polarized pixels. A pixel value I0 applies when the transmission axis is at a predetermined angle. A pixel value I1 applies when the transmission axis is at 45 degrees relative to the predetermined angle. The gain for absorbing the difference in sensitivity is set beforehand by calibration, for example, for each pixel or for each region constituted by multiple pixels.

$$y = a \cdot \sin(2x) + b \cdot \cos(2x) + c \quad (6)$$

$$c = Ic \quad (7)$$

$$a = c - KI0 \quad (8)$$

$$b = c - KI1 \quad (9)$$

A degree of polarization ρ is calculated on the basis of the expression (10) given below, and an azimuth angle φ is calculated through the use of the expression (11) given below.

[Math. 1]

$$\rho = \frac{\sqrt{a^2 + b^2}}{c} \quad (10)$$

$$\phi = \frac{1}{2}\arctan\frac{a}{b} \quad (11)$$

Thus, the polarization properties (polarization models) defined by the following expression (12) are obtained:

$$y = c(1 + \rho \cos(2(x - \varphi))) \quad (12)$$

Here, in the case where the pixel array is as depicted in FIG. 3, the specific color is green. In addition, an unpolarized component image of the color green is obtained by the unpolarized component image generating section 32-1, and polarized component images of the color green with the transmission axes at 90 and 135 degrees are acquired by the polarized component image generating section 33-1. It is to be noted that FIGS. 7A, 7B, and 7C depict green component images. FIG. 7A is an unpolarized component image, FIG. 7B is a polarized component image with the transmission axis at 90 degrees, and FIG. 7C is a polarized component image with the transmission axis at 135 degrees. The specific color polarization property detecting section 34-1 detects the polarization model of each pixel on the assumption that the pixel value of an unpolarized pixel having the color green is Ic, the pixel value of a polarized pixel with the transmission axis at 135 degrees is I0, and the pixel value of a polarized pixel with the transmission axis at 90 degrees is I1. The specific color polarization property detecting section 34-1 outputs the detected polarization properties of the specific color to the non-specific color polarization property detecting section 35.

The non-specific color polarization property detecting section 35 detects the polarization properties of the non-specific colors on the basis of the unpolarized component image signal of the non-specific colors obtained by the unpolarized component image generating section 32-1, the polarized component image signal of the non-specific colors acquired by the polarized component image generating section 33-1, and the polarization properties of the specific color detected by the specific color polarization property detecting section 34-1.

The non-specific color polarization property detecting section 35 detects the polarization properties of the non-specific colors on the assumption that the azimuth angle φ is the same for the specific and non-specific colors. In the case where the azimuth angle φ is the same for the specific and non-specific colors, the unknown parameters in the expression (12) above are the parameter c and the degree of polarization ρ. Thus, the non-specific color polarization property detecting section 35 calculates the degree of polarization ρ on the basis of the expression (10) above using, as the parameter c, the pixel value Ic of the unpolarized pixels of the non-specific colors obtained by the unpolarized component image generating section 32-1.

Here, in the case where the pixel array is as depicted in FIG. 3, the non-specific colors are red and blue. In addition, unpolarized component images of the color red and the color blue are obtained by the unpolarized component image generating section 32-1, and a polarized component image of the color red with the transmission axis at 90 degrees and a polarized component image of the color blue with the transmission axis at 135 degrees are acquired by the polarized component image generating section 33-1. Note that FIGS. 8A, 8B, 8C, and 8D depict red and blue component images. FIG. 8A is an unpolarized component image of the color red, FIG. 8B is a polarized component image of the color red, FIG. 8C is an unpolarized component image of the color blue, and FIG. 8D is a polarized component image of the color blue.

The non-specific color polarization property detecting section 35 calculates the degree of polarization ρ of each pixel for the color red on the assumption that an unpolarized pixel of the color red has the pixel value Ic, that the transmission axis (at 90 degrees) of a polarized pixel of the color red has the polarization angle x, and that the pixel value of a polarized pixel of the color red is the observed luminance y. Likewise, the non-specific color polarization property detecting section 35 calculates the degree of polarization ρ of each pixel for the color blue on the assumption that an unpolarized pixel of the color blue has the pixel value Ic, that the transmission axis (at 135 degrees) of a polarized pixel of the color blue has the polarization angle x, and that the pixel value is the observed luminance y. In such manner, the non-specific color polarization property detecting section 35 can detect the polarization properties of the non-specific colors even if the non-specific colors have fewer polarization directions than the specific color.

FIGS. 9A, 9B, and 9C depict exemplary polarization properties (polarization models). FIG. 9A indicates a polarization model of the specific color (green component) detected by the specific color polarization property detecting section 34-1. In addition, FIG. 9B illustrates a polarization model of a non-specific color (e.g., red component) detected by the non-specific color polarization property detecting section 34-1. FIG. 9C depicts a polarization model of another non-specific color (e.g., blue component) detected by the non-specific color polarization property detecting section 34-1. It is to be noted that in FIGS. 9A, 9B, and 9C, each small black circle represents the pixel value obtained from a polarized pixel. Moreover, an unpolarized pixel of the color green has a pixel value $C_G$, an unpolarized pixel of the color red has a pixel value $C_R$ and an unpolarized pixel of the color blue has a pixel value $C_B$.

Figure 10:
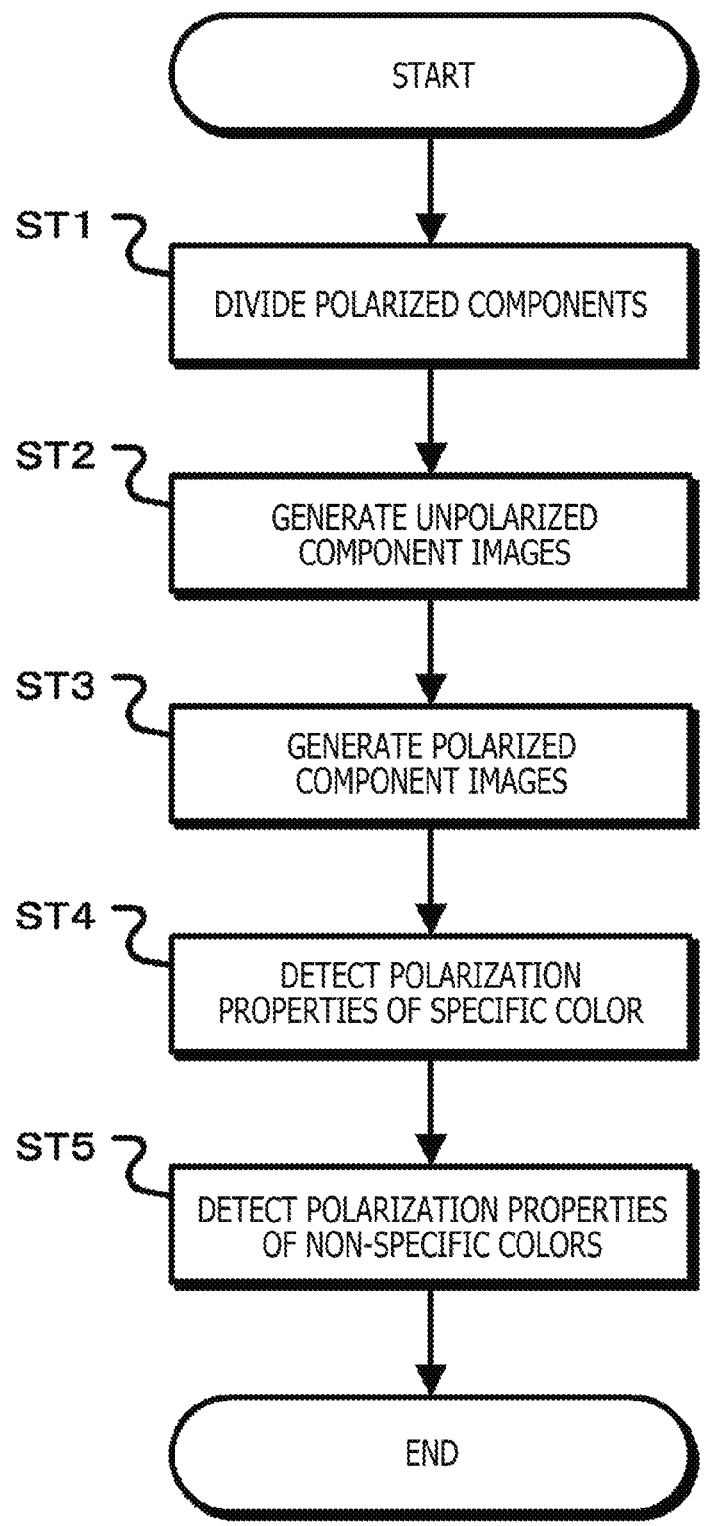
FIG. 10 is a flowchart depicting the operations of the first embodiment.

FIG. 10 is a flowchart depicting the operations of the first embodiment. In step ST1, the image processing apparatus divides polarized components. The image processing apparatus 30-1 divides the image signals of a polarized RAW image supplied from the solid-state imaging apparatus 20 into signals of unpolarized pixels and signals of polarized pixels so as to generate unpolarized image signals and polarized image signals. The image processing apparatus 30-1 then goes to step ST2.

In step ST2, the image processing apparatus generates unpolarized component images. The image processing apparatus 30-1 generates the unpolarized component image signal of each color from the unpolarized image signals obtained in step ST1, before going to step ST3.

In step ST3, the image processing apparatus generates polarized component images. The image processing apparatus 30-1 generates the polarized component image signal of each color in each polarization direction from the polarized image signals obtained in step ST1. The image processing apparatus 30-1 then goes to step ST4.

In step ST4, the image processing apparatus detects polarization properties of a specific color. The image processing apparatus 30-1 detects the polarization properties of the specific color on the basis of the polarized component image signal of the specific color generated in step ST3 and the unpolarized component image signal of the specific color generated in step ST2. The image processing apparatus 30-1 then goes to step ST5.

In step ST5, the image processing apparatus detects the polarization properties of non-specific colors. The image processing apparatus 30-1 detects the polarization properties of the non-specific colors on the basis of the polarization properties of the specific color detected in step ST4, the unpolarized component image signal of the non-specific colors generated in step ST2, and the polarized component image signal of the non-specific colors generated in step ST3.

As described above, the first embodiment permits highly accurate detection of the polarization properties of each color even in the case where the degree of polarization varies from one color to another. Furthermore, the polarized pixels of the non-specific colors are allowed to have fewer polarization directions than the polarized pixels of the specific color, so that the deterioration of image quality due to the polarized pixels being configured is reduced.

2. Second Embodiment

A second embodiment of this technology is explained below. In the above-described first embodiment, the resolution (number of pixels) of the unpolarized image output from the image processing apparatus 30-1 is half (½) that of the image acquired by the solid-state imaging apparatus 20, in the vertical and horizontal directions. In contrast, the second embodiment equalizes the resolution of unpolarized and polarized images output from the image processing apparatus to the resolution of the polarized RAW image supplied from the solid-state imaging apparatus.

2-1. Configuration of the Second Embodiment

FIG. 11 depicts an exemplary configuration of the second embodiment. An imaging system 10-2 includes a solid-state imaging apparatus 20 and an image processing apparatus 30-2. The image processing apparatus 30-2 includes an unpolarized component image generating section 32-2, a polarized component image generating section 33-2, a specific color polarization property detecting section 34-2, and a non-specific color polarization property detecting section 35.

The solid-state imaging apparatus 20 is configured in a manner similar to the first embodiment. The solid-state imaging apparatus 20 outputs image signals of a polarized RAW image having undergone white balance adjustment to the image processing apparatus 30-2.

The unpolarized component image generating section 32-2 in the image processing apparatus 30-2 generates the unpolarized component image signal of each color by performing the filtering process using the image signals of the polarized RAW image supplied from the solid-state imaging apparatus 20. In addition, the unpolarized component image generating section 32-2 outputs the unpolarized component image signal of the specific color to the specific color polarization property detecting section 34-2 and the unpolarized component image signal of the non-specific colors to the non-specific color polarization property detecting section 35.

The polarized component image generating section 33-2 performs the filtering process using the image signals of the polarized RAW image supplied from the solid-state imaging apparatus 20, thereby generating the polarized component image signal of each color in each polarization direction. The polarized component image generating section 33-2 further outputs the polarized component image signal of the specific color in each polarization direction to the specific color polarization property detecting section 34-2 and the polarized component image signal of the non-specific colors in each polarization direction to the non-specific color polarization property detecting section 35.

The specific color polarization property detecting section 34-2 detects the polarization properties of the specific color on the basis of the unpolarized component image signal and polarized component image signal of the specific color. The specific color polarization property detecting section 34-2 further outputs the detected polarization properties of the specific color to the non-specific color polarization property detecting section 35.

The non-specific color polarization property detecting section 35 detects the polarization properties of the non-specific colors on the basis of the polarization properties of the specific color detected by the specific color polarization property detecting section 34-1, the pixel signals of the unpolarized pixels of the non-specific colors, and the pixel signals of the polarized pixels of the non-specific colors having fewer polarization directions than the polarized pixels of the specific color.

2-2. Specific Examples and Operations of the Second Embodiment

The solid-state imaging apparatus 20 has the above-described configuration depicted in FIG. 2. For example, the solid-state imaging apparatus 20 has the pixel array such as that depicted in FIG. 3.

The unpolarized component image generating section 32-2 in the image processing apparatus 30-2 generates the unpolarized component image signal of each color by performing the filtering process using the image signals of the polarized RAW image supplied from the solid-state imaging apparatus 20. The unpolarized component image generating section 32-2 calculates an unpolarized low-frequency component of each color at a target pixel position using the pixel values of unpolarized pixels of each color from within the periphery of the target pixel position. Also, the unpolarized component image generating section 32-2 calculates a high-frequency component at the target pixel position by dividing the pixel value of the target pixel position by the unpolarized low-frequency component of the same color as at the target pixel position. Further, the unpolarized component image generating section 32-2 calculates the unpolarized pixel value of each color at the target pixel position by multiplying the high-frequency component at the target pixel position by the unpolarized low-frequency component of each color at the target pixel position.

FIGS. 12A and 12B are views for explaining the operations of the unpolarized component image generating section 32-2. FIG. 12A depicts a pixel arrangement of a polarized RAW image supplied from the solid-state imaging apparatus 20, and FIG. 12B indicates exemplary filter factors. For example, in the case where an unpolarized blue pixel depicted in FIG. 12A is a target pixel position Ps, the unpolarized low-frequency component of each color is calculated by performing the filtering process using the pixel values of unpolarized pixels having the same color from within the periphery of the target pixel position through the use of the filter factors indicated in FIG. 12B. For example, the unpolarized low-frequency component of the color green at the target pixel position is calculated by multiplying the pixel values of the unpolarized pixels having the color green and positioned in the periphery of the target pixel position by the filter factors corresponding to the unpolarized green pixels, and by dividing the sum of the results of the multiplications by the sum of the filter factors used in the multiplications.

The unpolarized component image generating section 32-2 calculates the high-frequency component at the target pixel position by diving the pixel value of the target pixel position by the low-frequency component of the same color in the same polarization direction as at the target pixel position. For example, in the case where the unpolarized blue pixel depicted in FIG. 12A is the target pixel position Ps, the high-frequency component at the target pixel position is calculated by dividing the pixel value of the unpolarized blue pixel as the target pixel position Ps by the unpolarized low-frequency component of the blue pixel calculated at the target pixel position.

Further, the unpolarized component image generating section 32-2 calculates the unpolarized pixel value of each color by individually multiplying the high-frequency component at the target pixel position by the unpolarized low-frequency component of each color at the target pixel position. For example, the unpolarized pixel value of the color green at the target pixel position is calculated by multiplying the high-frequency component calculated at the target pixel position by the unpolarized low-frequency component of the color green calculated at the target pixel position.

In such manner, the unpolarized component image generating section 32-2 multiplies the unpolarized low-frequency component of each color calculated at the target pixel position by the high-frequency component calculated at the target pixel position, thereby generating the unpolarized component image signal of each color without lowering the resolution (number of pixels) in the horizontal and vertical directions. The unpolarized component image generating section 32-2 outputs the unpolarized image signals of the specific color to the specific color polarization property detecting section 34-2 and the unpolarized image signals of the non-specific colors to the non-specific color polarization property detecting section 35.

The polarized component image generating section 33-2 performs the filtering process using the image signals of the polarized RAW image supplied from the solid-state imaging apparatus 20, thereby generating the polarized image signal of each color in each polarization direction. The polarized component image generating section 33-2 calculates the polarized low-frequency component of each color in each polarization direction at the target pixel position, using the pixel values of the polarized pixels of each color in each polarization direction from within the periphery of the target pixel position. Also, the polarized component image generating section 33-2 calculates the high-frequency component at the target pixel position by dividing the pixel value at the target pixel position by the low-frequency component of the same color in the same polarization direction as at the target pixel position. Further, the polarized component image generating section 33-2 multiples the high-frequency component at the target pixel position by the polarized low-frequency component of each color in each polarization direction at the target pixel position, thereby calculating the polarized pixel value of each color in each polarization direction at the target pixel position.

For example, in the case where the unpolarized blue pixel depicted in FIG. 12A is the target pixel position Ps, the polarized low-frequency component of each color in each polarization direction is calculated by performing the filtering process using the pixel values of the polarized pixels of the same color in the same polarization direction from within the periphery of the target pixel position through the use of the filter factors indicated in FIG. 12B. For example, the low-frequency component of the color red at the target pixel position is calculated by multiplying the pixel values of the polarized red pixels in the periphery of the target pixel position by the filter factors corresponding to the polarized red pixels, and by dividing the sum of the results of the multiplications by the sum of the filter factors used in the multiplications.

The polarized component image generating section 33-2 calculates the high-frequency component at the target pixel position by dividing the pixel value at the target pixel position by the low-frequency component of the same color in the same polarization direction as at the target pixel position. For example, in the case where the unpolarized blue pixel depicted in FIG. 12A is the target pixel position Ps, the high-frequency component at the target pixel position is calculated by dividing the pixel value of the unpolarized blue pixel as the target pixel position Ps by the unpolarized low-frequency component of the blue pixel calculated at the target pixel position.

Further, the polarized component image generating section 33-2 calculates the polarized pixel value of each color in each polarization direction by individually multiplying the high-frequency component at the target pixel position by the polarized low-frequency component of each color in each polarization direction at the target pixel position. For example, the unpolarized pixel value of the color red at the target pixel position is calculated by multiplying the high-frequency component calculated at the target pixel position by the polarized low-frequency component of the color red calculated at the target pixel position.

In such manner, the polarized component image generating section 33-2 multiplies the polarized low-frequency component of each color in each polarization direction calculated at the target pixel position by the high-frequency component calculated at the target pixel position, thereby generating the polarized component image signal of each color in each polarization direction without lowering the resolution (number of pixels) in the horizontal and vertical directions. The polarized component image generating section 33-2 outputs the polarized image signals of the specific color to the specific color polarization property detecting section 34-2 and the polarized image signals of the non-specific colors to the non-specific color polarization property detecting section 35.

The specific color polarization property detecting section 34-2 performs processing similar to that of the first embodiment on the basis of the unpolarized image signals of the specific color obtained by the unpolarized component image generating section 32-2 and the polarized image signals of the specific color acquired by the polarized component image generating section 33-2, thereby detecting the polarization properties of the specific color. The specific color polarization property detecting section 34-2 outputs the detected polarization properties of the specific color to the non-specific color polarization property detecting section 35.

The non-specific color polarization property detecting section 35 performs processing similar to that of the first embodiment on the basis of the unpolarized image signals of the non-specific colors obtained by the unpolarized component image generating section 32-2, the polarized image signals of the non-specific colors acquired by the polarized component image generating section 33-2, and the polarization properties of the specific color detected by the specific color polarization property detecting section 34-2, thereby detecting the polarization properties of the non-specific colors.

Figure 13:
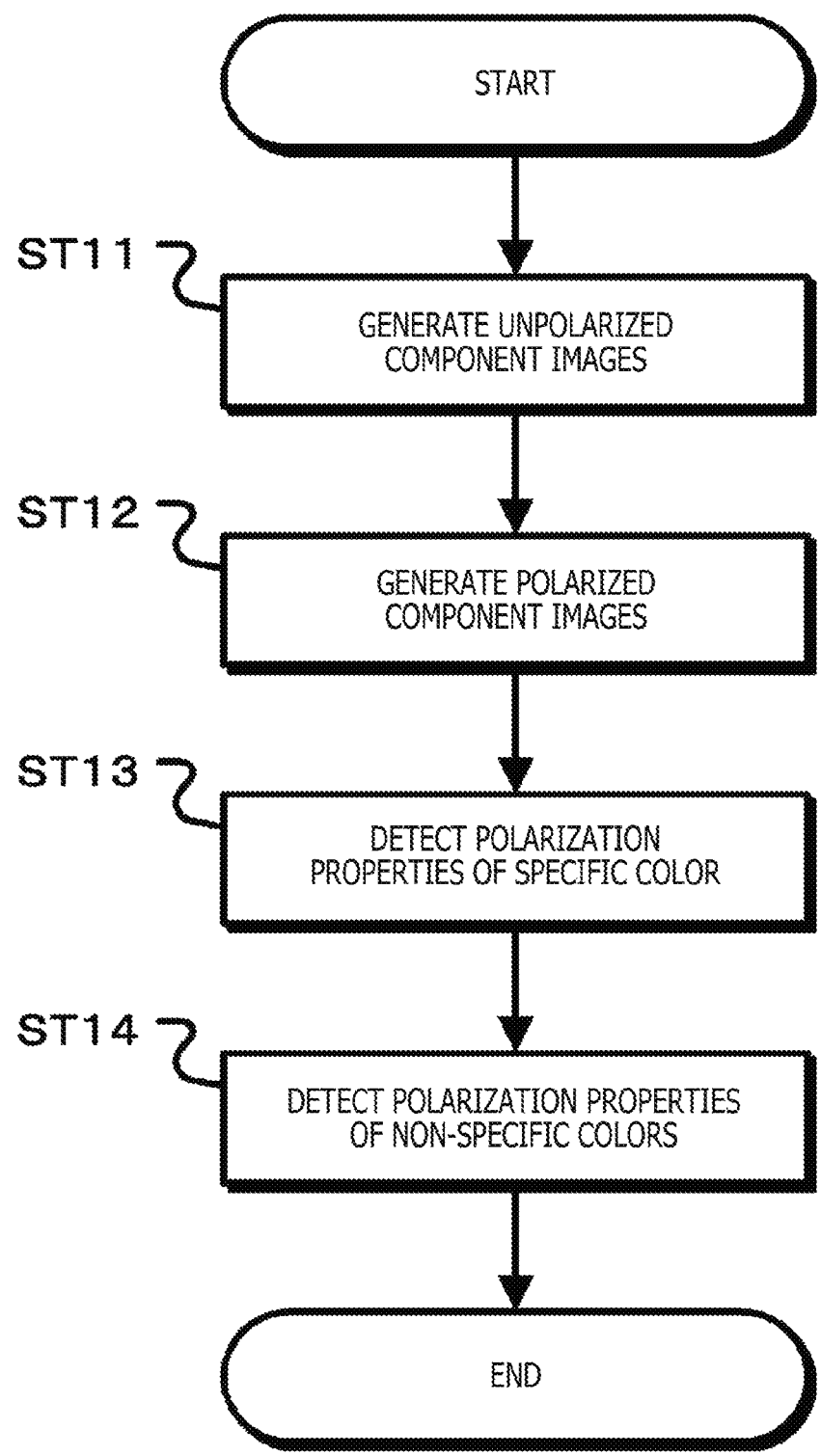
FIG. 13 is a flowchart depicting the operations of the second embodiment.

FIG. 13 is a flowchart depicting the operations of the second embodiment. In step ST11, the image processing apparatus generates unpolarized component images. The image processing apparatus 30-2 generates the unpolarized component image signal of each color by performing the filtering process using the signals of the unpolarized pixels of the same color out of the image signals of the polarized RAW image supplied from the solid-state imaging apparatus 20. The image processing apparatus 30-2 then goes to step ST12.

In step ST12, the image processing apparatus generates polarized component images. The image processing apparatus 30-2 generates the polarized component image signal of each color in each polarization direction by performing the filtering process using the signals of the polarized pixels of the same color in the same polarization direction out of the image signals of the polarized RAW image supplied from the solid-state imaging apparatus 20. The image processing apparatus 30-2 then goes to step ST13.

In step ST13, the image processing apparatus detects the polarization properties of the specific color. The image processing apparatus 30-2 detects the polarization properties of the specific color on the basis of the polarized component image signal of the specific color generated in step ST12 and the unpolarized component image signal of the specific color generated in step ST11. The image processing apparatus 30-2 then goes to step ST14.

In step ST14, the image processing apparatus detects the polarization properties of the non-specific colors. The image processing apparatus 30-2 detects the polarization properties of the non-specific colors on the basis of the polarization properties of the specific color detected in step ST13, the unpolarized component image signal of the non-specific colors generated in step ST11, and the polarized component image signal of the non-specific colors generated in step ST12.

The above-described second embodiment, as with the first embodiment, permits highly accurate detection of the polarization properties of each color even in the case where the degree of polarization varies from one color to another. Also, the polarized pixels of the non-specific colors are allowed to have fewer polarization directions than the polarized pixels of the specific color, so that the deterioration of image quality due to the polarized pixels being configured is reduced. Furthermore, the unpolarized image of each color and the polarized image of each color in each polarization direction can be generated without incurring deterioration of the resolution.

3-1. Configuration of the Third Embodiment

Figure 14:
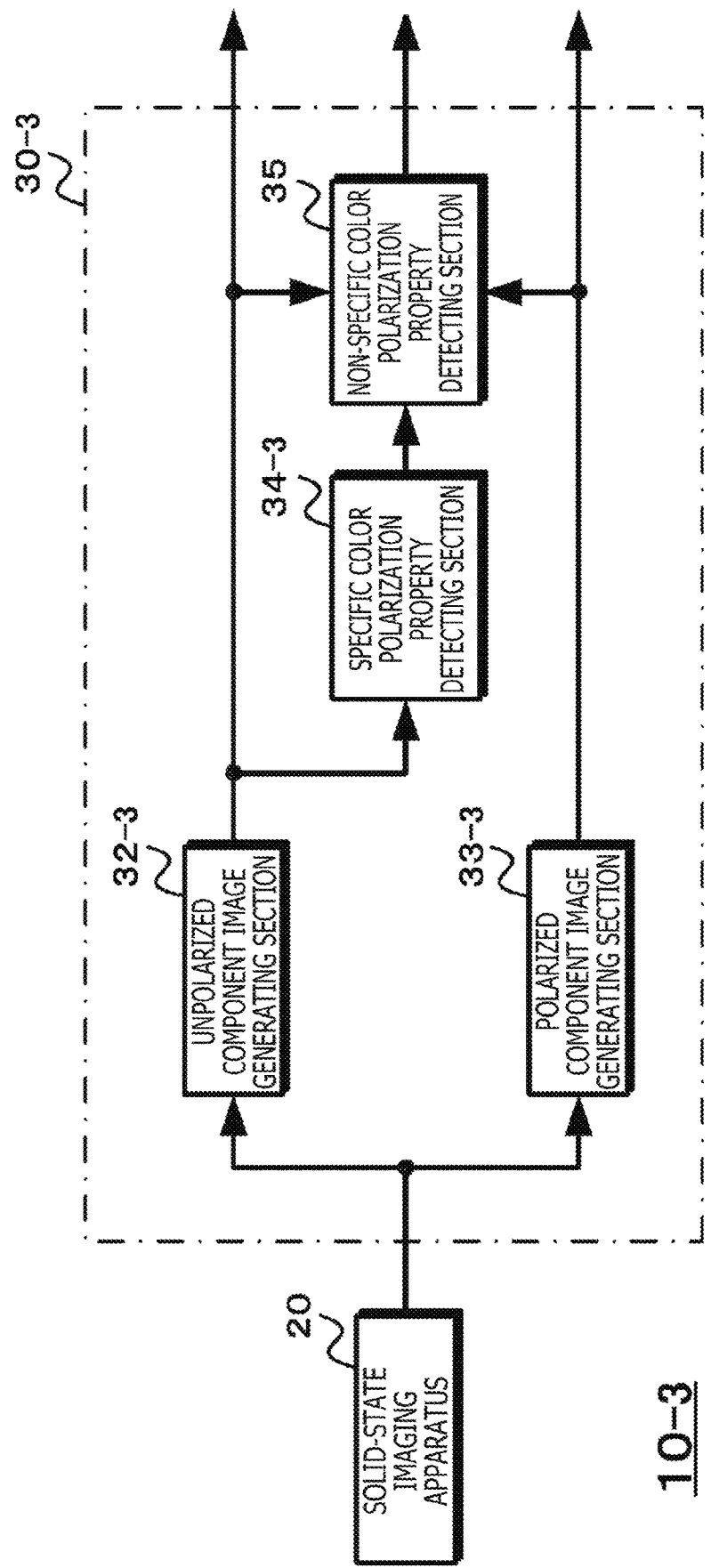
FIG. 14 is a view depicting an exemplary configuration of a third embodiment of this technology.

FIG. 14 depicts an exemplary configuration of a third embodiment of this technology. An imaging system 10-3 includes a solid-state imaging apparatus 20 and an image processing apparatus 30-3. The image processing apparatus 30-3 includes an unpolarized component image generating section 32-3, a polarized component image generating section 33-3, a specific color polarization property detecting section 34-3, and a non-specific color polarization property detecting section 35.

The solid-state imaging apparatus 20 is configured in a manner similar to the first embodiment and has a pixel array different from that of the first embodiment. FIG. 15 depicts an exemplary pixel array of the solid-state imaging apparatus. This is an example in which the green pixels have four polarization directions, with the red and the blue pixels each having one polarization direction. The solid-state imaging apparatus 20 outputs image signals of a polarized RAW image having undergone white balance adjustment to the image processing apparatus 30-3.

The image processing apparatus 30-3 generates unpolarized images of each color, generates polarized images of each color in each polarization direction, and detects the polarization properties of each color, regardless of the pixel array being configured in the solid-state imaging apparatus 20.

The unpolarized component image generating section 32-3 in the image processing apparatus 30-3 generates the unpolarized component image signal of each color by performing the filtering process using the image signals of the polarized RAW image supplied from the solid-state imaging apparatus 20. The unpolarized component image generating section 32-3 outputs the unpolarized component image signal of the specific color to the specific color polarization property detecting section 34-3 and the unpolarized component image signal of the non-specific colors to the non-specific color polarization property detecting section 35.

The polarized component image generating section 33-3 performs the filtering process using the image signals of the polarized RAW image supplied from the solid-state imaging apparatus 20, thereby generating the polarized component image signal of each color in each polarization direction. The polarized component image generating section 33-3 outputs the polarized component image signal of the specific color to the specific color polarization property detecting section 34-3 and the polarized component image signal of the non-specific colors to the non-specific color polarization property detecting section 35.

The specific color polarization property detecting section 34-3 detects the polarization properties of the specific color on the basis of the polarized component image signal of the specific color or the unpolarized component image signal and polarized component image signal of the specific color. The specific color polarization property detecting section 34-3 further outputs the detected polarization properties of the specific color to the non-specific color polarization property detecting section 35.

The non-specific color polarization property detecting section 35 detects the polarization properties of the non-specific colors on the basis of the unpolarized component image signal and polarized component image signal of the non-specific colors and the polarization properties of the specific color.

3-2. Specific Examples and Operations of the Third Embodiment

The solid-state imaging apparatus 20 has the above-described configuration depicted in FIG. 2. For example, the solid-state imaging apparatus 20 has the pixel array such as that depicted in FIG. 15.

The unpolarized component image generating section 32-3 in the image processing apparatus 30-3 generates the unpolarized component image signal of each color by performing the filtering process using the image signals of the polarized RAW image supplied from the solid-state imaging apparatus 20. The unpolarized component image generating section 32-3 calculates the unpolarized pixel value of each color at the target pixel position, which is the middle position of a 2×2-pixel color region unit, using the values of the unpolarized pixels having the same color and positioned in the periphery of the target pixel position.

FIGS. 16A and 16B are views for explaining the operations of the unpolarized component image generating section 32-3. FIG. 16A depicts the pixel arrangement of the image signal supplied from the solid-state imaging apparatus 20, and FIG. 12B indicates exemplary filter factors. For example, in the case where the middle position of a 2×2-pixel blue color region unit is the target pixel position Ps as depicted FIG. 16A, the unpolarized pixel value of the non-specific color pixel at the target pixel position is calculated by performing the filtering process using the values of the unpolarized pixels having the same color and positioned in the periphery of the target pixel position, through the use of the filter factors indicated in FIG. 16B. Specifically, the pixel values of the unpolarized blue pixels positioned in the periphery of the target pixel position are multiplied by the filter factors corresponding to the unpolarized blue pixels. The sum of the results of the multiplications is divided by the sum of the filter factors used in the multiplications. As a result, the pixel value of the unpolarized blue pixel at the target pixel position is calculated. Also, similar processing is performed using the unpolarized red pixels so as to calculate the unpolarized pixel value of the red pixel at the target pixel position.

FIGS. 17A, 17B, 17C, 17D, 17E, 17F, 17G, and 17H depict unpolarized component images and polarized component images. The unpolarized component image generating section 32-3 calculates the values of the unpolarized pixels of the non-specific colors at the target pixel position, thereby generating the unpolarized component image of the color red depicted in FIG. 17A and the unpolarized component image of the color blue illustrated in FIG. 7B, the images having half the resolution (number of pixels) in the horizontal and vertical directions. The unpolarized component image generating section 32-3 outputs the unpolarized component image signal of the non-specific colors to the non-specific color polarization property detecting section 35.

The polarized component image generating section 33-3 generates the polarized component image signal of each color component in each polarization direction by performing the filtering process using the image signals of the polarized RAW image supplied from the solid-state imaging apparatus 20. As with the unpolarized component image generating section 32-3, the polarized component image generating section 33-3 calculates the polarized pixel value of each color in each polarization direction at the target pixel position, which is the middle position of a 2×2-pixel color region unit, using the values of the polarized pixels of the same color having the same polarization direction and positioned in the periphery of the target pixel position.

For example, in the case where the middle position of a 2×2-pixel blue color region unit is the target pixel position Ps as depicted in FIG. 16A, the polarized component image generating section 33-3 performs the filtering process using the pixel values of the polarized pixels of the same color having the same polarization direction and positioned in the periphery of the target pixel position, through the use of the filter factors indicated in FIG. 16B, thereby calculating the polarized pixel value of each color in each polarization direction at the target pixel position. Specifically, the polarized pixel values of the blue pixels having the same polarization direction and positioned in the periphery of the target pixel position Ps are multiplied by the filter factors corresponding to the same polarized blue pixels. The sum of the results of the multiplications is divided by the sum of the filter factors used in the multiplications. As a result, the pixel value of the polarized blue pixel at the target pixel position is calculated. Also, similar processing is performed using the red and green pixels so as to calculate the polarized pixel values of the red pixels at the target pixel position and those of the green pixels in each polarization direction.

In such manner, the polarized component image generating section 33-3 calculates the pixel values of the polarized pixels of each color in each polarization direction at the target pixel position, thereby generating the polarized images of each color in each polarization direction depicted in FIGS. 17C, 17D, 17E, 17F, 17G, and 17H, the images having half the resolution (number of pixels) in the horizontal and vertical directions. It is to be noted that in FIGS. 17A, 17B, 17C, 17D, 17E, and 17F, FIGS. 17C, 17D, 17E, and 17F depict polarized component images of the color green in each polarization direction, FIG. 17G illustrates a polarized component image of the color red, and FIG. 17H indicates a polarized component image of the color blue. The polarized component image generating section 33-3 outputs the polarized component image signal of the color green, which is the specific color, to the specific color polarization property detecting section 34-3 and the polarized component image signals of the color red and color blue, which are the non-specific colors, to the non-specific color polarization property detecting section 35.

The specific color polarization property detecting section 34-3 detects the polarization properties of the specific color on the basis of the polarized component image signal of the specific color obtained by the polarized component image generating section 33-3. The polarized component image generating section 33-3 generates the polarized component images in four polarization directions as depicted in FIGS. 17C, 17D, 17E, 17F, 17G, and 17H. Thus, the parameters a, b, and c in the above-described expression (6) are calculated using the following expressions (13) to (15):

$$a=(I45-I135)/2 \quad (13)$$

$$b=(I0-I90)/2 \quad (14)$$

$$c=(I0+I45+I90+I135)/4 \quad (15)$$

Further, the degree of polarization ρ is calculated using the expression (10), and the azimuth angle φ is calculated using the expression (11), as described above. The polarization properties are thus obtained as defined by the expression (12) given above. The specific color polarization property detecting section 34-3 outputs the detected polarization properties of the specific color to the non-specific color polarization property detecting section 35.

The non-specific color polarization property detecting section 35 detects the polarization properties of the non-specific colors by performing processing similar to that of the first embodiment, on the basis of the unpolarized component image signal of the non-specific colors obtained by the unpolarized component image generating section 32-3, the polarized component image signal of the non-specific colors acquired by the polarized component image generating section 33-3, and the polarization properties of the specific color detected by the specific color polarization property detecting section 34-3.

Note that the unpolarized component image generating section 32-3 generates the unpolarized component image signal of the specific colors but not that of the specific color. However, by calculating an average of the polarized pixel values at each pixel position using the polarized images in four polarization directions with the transmission axes having an angular difference of 45 degrees therebetween, the unpolarized component image generating section 32-3 can generate an unpolarized component image of the specific color without recourse to the unpolarized pixels of the specific color.

Note that the operations of the third embodiment are similar to those described in the flowchart of FIG. 13. The third embodiment performs the above-described filtering process different from that of the second embodiment, thereby generating the unpolarized and polarized component images and detecting the polarization properties of each color.

The above-described third embodiment, as with the first embodiment, permits highly accurate detection of the polarization properties of each color even in the case where the degree of polarization varies from one color to another. Also, the polarized pixels of the non-specific colors are allowed to have fewer polarization directions than the polarized pixels of the specific color, so that the deterioration of image quality due to the polarized pixels being configured is reduced. Furthermore, because the unpolarized and polarized component images are generated for each color region unit and because the polarization properties of each color are detected, it is possible to handle diverse pixel arrays of the solid-state imaging apparatus.

4. Fourth Embodiment

Whereas the above-described first through third embodiments detect the polarization properties of each color and generate the polarized and unpolarized component images of each color, using the white balance-adjusted image signals of the polarized RAW image, such processes may be carried out using image signals which have not undergone white balance adjustment. A fourth embodiment of this technology is explained below in conjunction with the case where image signals which have not undergone white balance adjustment are used.

4-1. Configuration of the Fourth Embodiment

Figure 18:
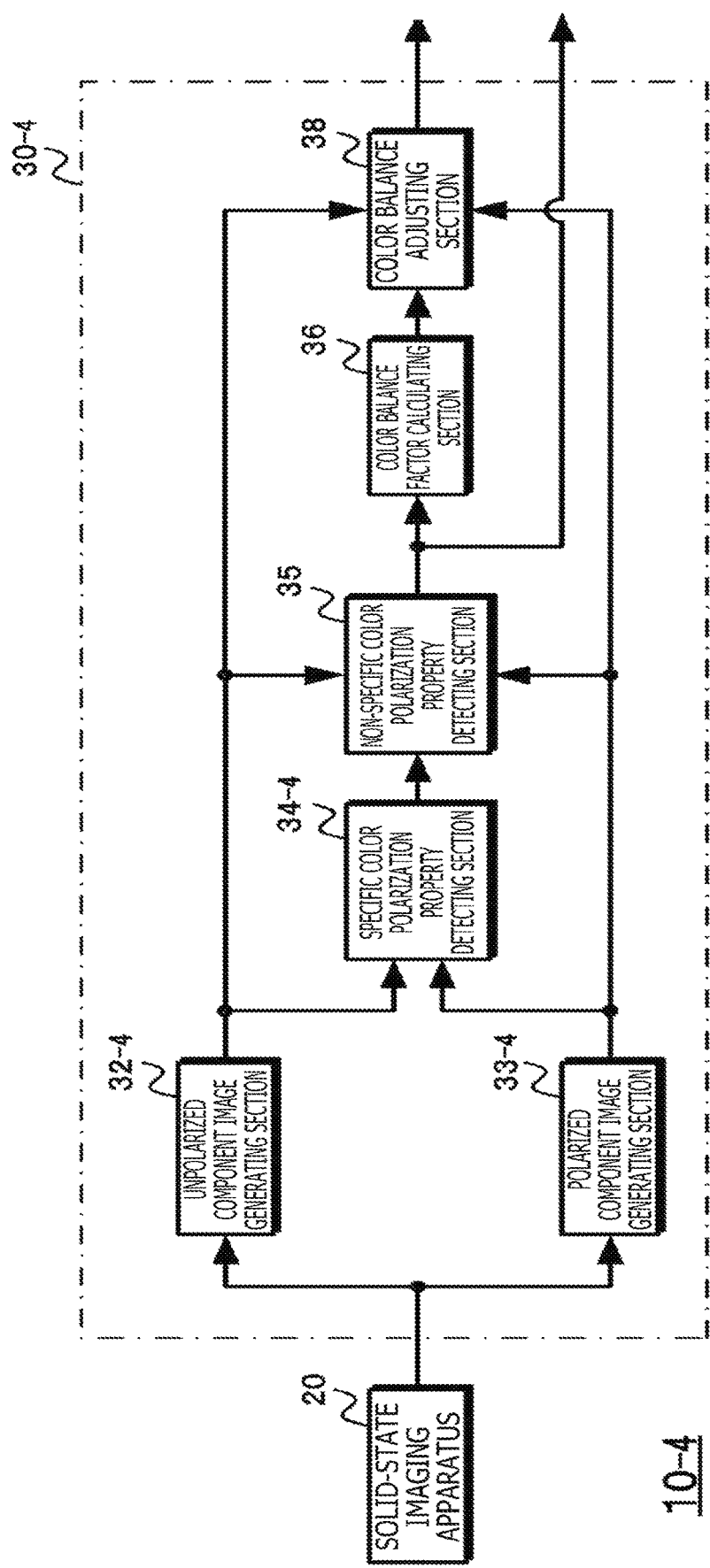
FIG. 18 is a view depicting an exemplary configuration of a fourth embodiment of this technology.

FIG. 18 depicts an exemplary configuration of the fourth embodiment. An imaging system 10-4 includes a solid-state imaging apparatus 20 and an image processing apparatus 30-4. The image processing apparatus 30-4 includes an unpolarized component image generating section 32-4, a polarized component image generating section 33-4, a specific color polarization property detecting section 34-4, a non-specific color polarization property detecting section 35, a color balance factor calculating section 36, and a color balance adjusting section 38.

The solid-state imaging apparatus 20 has the pixel array similar to that of the first, second, or third embodiment. The solid-state imaging apparatus 20 outputs the image signals of the polarized RAW image that have not undergone white balance adjustment to the image processing apparatus 30-4.

The unpolarized component image generating section 32-4 in the image processing apparatus 30-4 generates the unpolarized component image signal of each color by performing the filtering process using the image signals of the polarized RAW image supplied from the solid-state imaging apparatus 20. The unpolarized component image generating section 32-4 outputs the unpolarized component image signal of the specific color to the specific color polarization property detecting section 34-4 and the unpolarized component image signal of the non-specific colors to the non-specific color polarization property detecting section 35.

The polarized component image generating section 33-4 generates the polarized component image signal of each color in each polarization direction by performing the filtering process using the image signals of the polarized RAW image supplied from the solid-state imaging apparatus 20. The polarized component image generating section 33-4 outputs the polarized component image signal of the specific color to the specific color polarization property detecting section 34-4 and the polarized component image signal of the non-specific colors to the non-specific color polarization property detecting section 35.

The specific color polarization property detecting section 34-4 detects the polarization properties of the specific color on the basis of the unpolarized and polarized component image signals of the specific color. The specific color polarization property detecting section 34-4 outputs the detected polarization properties of the specific color to the non-specific color polarization property detecting section 35.

The non-specific color polarization property detecting section 35 detects the polarization properties of the non-specific colors on the basis of the unpolarized and polarized component images of the non-specific colors and the polarization properties of the specific color. The non-specific color polarization property detecting section 35 outputs the detected polarization properties of the non-specific colors and the polarization properties of the specific color detected by the specific color polarization property detecting section 34-4 to the color balance factor calculating section 36.

The color balance factor calculating section 36 calculates color balance factors on the basis of the polarization properties of the specific color and the polarization properties of the non-specific colors. The color balance factor calculating section 36 outputs the calculated color balance factors to the color balance adjusting section 38.

The color balance adjusting section 38 performs white balance adjustment on the unpolarized and polarized component images, using the color balance factors calculated by the color balance factor calculating section 36.

4-2. Specific Examples and Operations of the Fourth Embodiment

The solid-state imaging apparatus 20 has the above-described configuration depicted in FIG. 2. For example, the solid-state imaging apparatus 20 has the pixel array such as that illustrated in FIG. 3 or in FIG. 15.

The unpolarized component image generating section 32-4 in the image processing apparatus 30-4 performs processing similar to that of the unpolarized component image generating section 32-2 or 32-3 in the second or the third embodiment. Likewise, the polarized component image generating section 33-4, the specific color polarization property detecting section 34-4, and the non-specific color polarization property detecting section 35 perform processing similar to that of their counterparts in the second or the third embodiment. Preferably, the polarized component dividing section 31 of the first embodiment may be configured in the fourth embodiment so as to perform processing similar to that of the first embodiment. The non-specific color polarization property detecting section 35 outputs the detected polarization properties of the non-specific colors and the polarization properties of the specific color detected by the specific color polarization property detecting section 34-4 to the color balance factor calculating section 36. Moreover, the specific color polarization property detecting section 34-4 and the non-specific color polarization property detecting section 35 output the unpolarized component image signal of each color component and the polarized component image signal of each color component in each polarization direction to the color balance adjusting section 38.

The color balance factor calculating section 36 calculates the color balance factors on the basis of the polarization properties of the specific color and those of the non-specific colors. In calculating the color balance factors on the basis of the polarization properties, the color balance factor calculating section 36 considers the specular reflection component to be the color white.

An amplitude φ of polarization properties in the expression (12) above denotes the specular reflection component. In the case where the specular reflection component is the color white, the amplitude of the polarization properties of the specific color is equal to the amplitude of the polarization properties of the non-specific colors. Thus, the color balance factor calculating section 36 calculates, as the color balance factors, the gains that equalize the amplitude of the polarization properties of the non-specific colors to the amplitude of the polarization properties of the specific color.

FIGS. 19A, 19B, and 19C are views for explaining color balance factors. When the specular reflection component is considered to be the color white, the amplitude of the polarization properties of the specific color is equal to the amplitude of the polarization properties of the non-specific colors. It follows that when the specific color is green as discussed above, the expression (16) given below defines the relations between the amplitude $c_G \rho_G$ of a green polarized image on one hand and the amplitude $c_G \rho_G$ of a red polarized image and the amplitude $c_R \rho_R$ of a blue polarized image on the other hand. Note that it is assumed that an unpolarized pixel of the color green has a pixel value $C_G$, an unpolarized pixel of the color red has a pixel value CR, and an unpolarized pixel of the color blue has a pixel value CB and that the color green has a degree of polarization $\rho_G$, the color red has a degree of polarization $\rho_R$, and the color blue has a degree of polarization $\rho_B$. Thus, the color balance factor calculating section 36 calculates gains $g_R$ and $g_B$ as the color balance factors.

$$c_G \rho_G = g_R c_R \rho_R = g_B c_B \rho_B \tag{16}$$

Thus, on the basis of the polarization properties of the specific color and those of the non-specific colors, the color balance factor calculating section 36 performs calculations by the expressions (17) and (18) below to obtain the color balance factors $g_R$ and $g_B$. The color balance factor calculating section 36 outputs the calculated color balance factors $g_R$ and $g_B$ to the color balance adjusting section 38.

$$g_R = (c_G \rho_G)/(c_R \rho_R) \tag{17}$$

$$g_B = (c_G \rho_G)/(c_B \rho_B) \tag{18}$$

The color balance adjusting section 38 performs gain adjustment on the unpolarized and polarized images of the non-specific colors, using the color balance factors calculated by the color balance factor calculating section 36, thereby generating the white balance-adjusted unpolarized component image signal of each color and the white balance-adjusted polarized component image signal of each color in each polarization direction.

Figure 20:
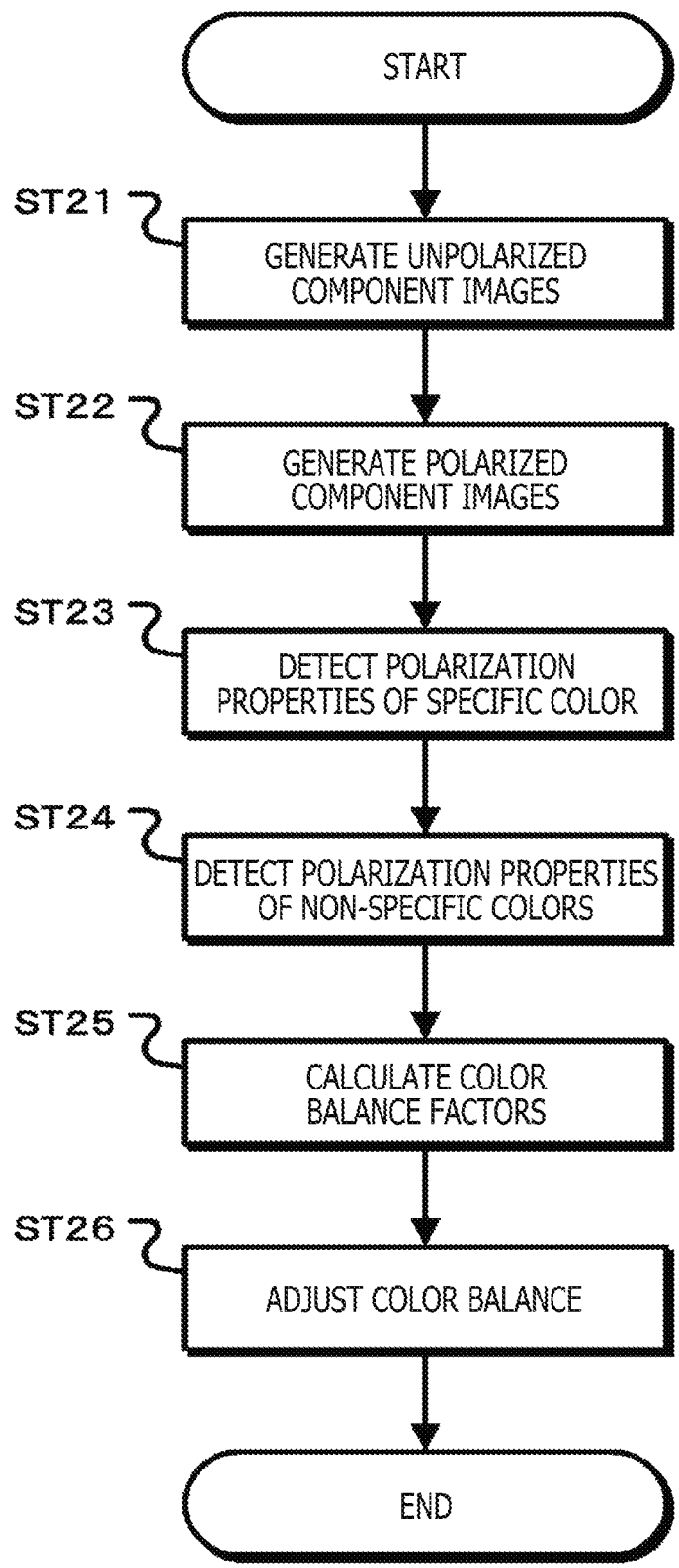
FIG. 20 is a flowchart depicting the operations of the fourth embodiment.

FIG. 20 is a flowchart depicting the operations of the fourth embodiment. In step ST21, the image processing apparatus generates unpolarized component images. The image processing apparatus 30-4 generates the unpolarized component image signal of each color by performing the filtering process using the signals of the unpolarized pixels of the same color out of the image signals of the polarized RAW image supplied from the solid-state imaging apparatus 20. The image processing apparatus 30-4 then goes to step ST22.

In step ST22, the image processing apparatus generates polarized component images. The image processing apparatus 30-4 generates the polarized component image signal of each color in each polarization direction by performing the filtering process using the signals of the polarized pixels of the same color in the same polarization direction out of the image signals of the polarized RAW image supplied from the solid-state imaging apparatus 20. The image processing apparatus 30-4 then goes to step ST23.

In step ST23, the image processing apparatus detects the polarization properties of the specific color. The image processing apparatus 30-4 detects the polarization properties of the specific color on the basis of the polarized component image signal of the specific color generated in step ST22 and the unpolarized component image signal of the specific color generated in step ST21. The image processing apparatus 30-4 then goes to step ST24.

In step ST24, the image processing apparatus detects the polarization properties of the non-specific colors. The image processing apparatus 30-4 detects the polarization properties of the non-specific colors on the basis of the polarization properties of the specific color detected in step ST23, the unpolarized component image signal of the non-specific colors generated in step ST21, and the polarized component image signal of the non-specific colors generated in step ST22. The image processing apparatus 30-4 then goes to step ST25.

In step ST25, the image processing apparatus calculates color balance factors. The image processing apparatus 30-4 calculates, as the color balance factors, the gains that equalize the amplitude of the polarization properties of the non-specific colors to the amplitude of the polarization properties of the specific color, on the basis of the polarization properties of the specific color detected in step ST23 and the polarization properties of the non-specific colors detected in step ST24. The image processing apparatus 30-4 then goes to step ST26.

In step ST26, the image processing apparatus performs color balance adjustment. The image processing apparatus 30-4 performs gain adjustment on the unpolarized component image signal of the non-specific colors generated in step ST21, through the use of the color balance factors calculated in step ST25. Preferably, the image processing apparatus 30-4 may perform gain adjustment on the polarized component image signal of the non-specific colors generated in step ST22, using the color balance factors calculated in step ST25.

The above-described fourth embodiment, as with the first embodiment, permits highly accurate detection of the polarization properties of each color even in the case where the degree of polarization varies from one color to another. Also, the polarized pixels of the non-specific colors are allowed to have fewer polarization directions than the polarized pixels of the specific color, so that the deterioration of image quality due to the polarized pixels being configured is reduced. Furthermore, because the color balance factors are calculated on the basis of the polarization properties, it is possible to obtain the image signals having undergone highly accurate white balance adjustment even in the case where the illumination light source is unknown or where no white subject is included in imaging regions.

5. Fifth Embodiment

A fifth embodiment of this technology is explained below in conjunction with the case where it is possible to acquire the color balance factors based on polarization properties and the color balance factors based on the color information for reproducing the color white of a white subject.

5-1. Configuration of the Fifth Embodiment

Figure 21:
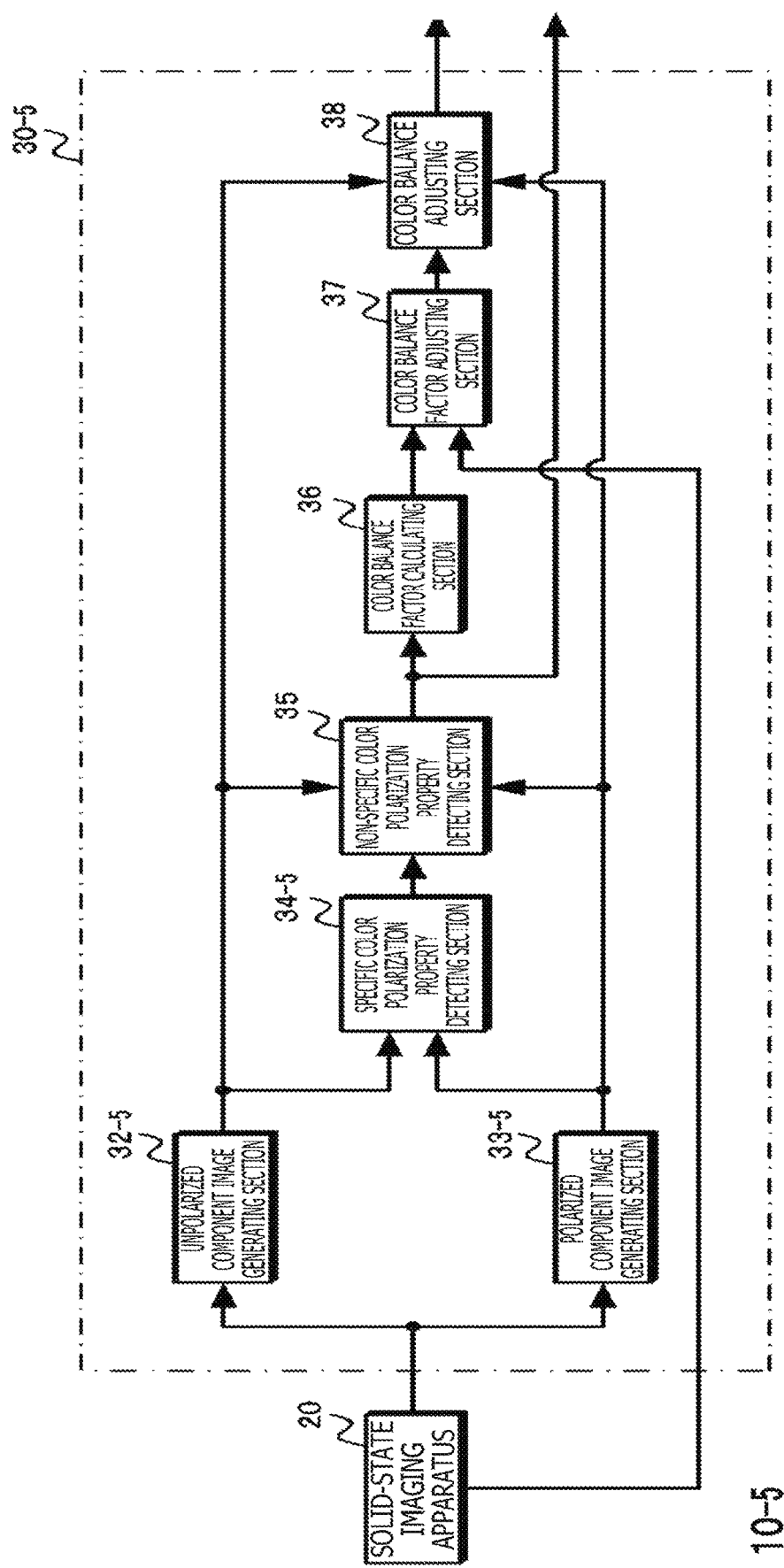
FIG. 21 is a view depicting an exemplary configuration of a fifth embodiment of this technology.

FIG. 21 depicts an exemplary configuration of the fifth embodiment. An imaging system 10-5 includes a solid-state imaging apparatus 20 and an image processing apparatus 30-5. The image processing apparatus 30 includes an unpolarized component image generating section 32-5, a polarized component image generating section 33-5, a specific color polarization property detecting section 34-5, a non-specific color polarization property detecting section 35, a color balance factor calculating section 36, a color balance factor adjusting section 37, and a color balance adjusting section 38.

The solid-state imaging apparatus 20 has the pixel array similar to that of the first, second, or third embodiment. The solid-state imaging apparatus 20 outputs the image signals of the polarized RAW image that have not undergone white balance adjustment to the image processing apparatus 30-5.

The unpolarized component image generating section 32-5 in the image processing apparatus 30-5 generates the unpolarized component image signal of each color by performing the filtering process using the image signals of the polarized RAW image supplied from the solid-state imaging apparatus 20. The unpolarized component image generating section 32-5 outputs the unpolarized component image signal of the specific color to the specific color polarization property detecting section 34-5 and the unpolarized component image signal of the non-specific colors to the non-specific color polarization property detecting section 35.

The polarized component image generating section 33-5 generates the polarized component image signal of each color in each polarization direction by performing the filtering process using the image signals of the polarized RAW image supplied from the solid-state imaging apparatus 20. The polarized component image generating section 33-5 outputs the polarized component image signal of the specific color to the specific color polarization property detecting section 34-5 and the polarized component image signal of the non-specific colors to the non-specific color polarization property detecting section 35.

The specific color polarization property detecting section 34-5 detects the polarization properties of the specific color on the basis of the unpolarized and polarized component image signals of the specific color. The specific color polarization property detecting section 34-5 outputs the detected polarization properties of the specific color to the non-specific color polarization property detecting section 35.

The non-specific color polarization property detecting section 35 detects the polarization properties of the non-specific colors on the basis of the unpolarized and polarized component images of the non-specific colors and the polarization properties of the specific color. The non-specific color polarization property detecting section 35 outputs the detected polarization properties of the non-specific colors and the polarization properties of the specific color detected by the specific color polarization property detecting section 34-5 to the color balance factor calculating section 36.

The color balance factor calculating section 36 calculates color balance factors on the basis of the polarization properties of the specific color and the polarization properties of the non-specific colors. The color balance factor calculating section 36 outputs the calculated color balance factors to the color balance adjusting section 38.

The color balance factor adjusting section 37 adjusts the color balance factors, using the color balance factors based on the color information for reproducing the color white of a white subject and the color balance factors calculated by the color balance factor calculating section 36, thereby generating adjusted color balance factors. Preferably, the color balance factors based on the color information may be acquired from the solid-state imaging apparatus 20 or may be stored in the image processing apparatus 30-5. The color balance factor adjusting section 37 outputs the adjusted color balance factors to the color balance adjusting section 38.

The color balance adjusting section 38 performs white balance adjustment on the unpolarized and polarized images, using the adjusted color balance factors generated by the color balance factor adjusting section 37.

5-2. Specific Examples and Operations of the Fifth Embodiment

The solid-state imaging apparatus 20 has the above-described configuration depicted in FIG. 2. For example, the solid-state imaging apparatus 20 has the pixel array such as that illustrated in FIG. 3 or in FIG. 15.

The unpolarized component image generating section 32-5 in the image processing apparatus 30-5 performs processing similar to that of the unpolarized component image generating section 32-2 or 32-3 in the second or the third embodiment. Likewise, the polarized component image generating section 33-5, the specific color polarization property detecting section 34-5, and the non-specific color polarization property detecting section 35 perform processing similar to that of their counterparts in the second or the third embodiment. Preferably, the polarized component dividing section 31 of the first embodiment may be configured in the fifth embodiment so as to perform processing similar to that of the first embodiment. The non-specific color polarization property detecting section 35 outputs the detected polarization properties of the non-specific colors and the polarization properties of the specific color detected by the specific color polarization property detecting section 34-5 to the color balance factor calculating section 36. In addition, the specific color polarization property detecting section 34-5 and the non-specific color polarization property detecting section 35 output the unpolarized component image signal of each color component and the polarized component image signal of each color component in each polarization direction to the color balance adjusting section 38.

The color balance factor calculating section 36, as with the fourth embodiment, calculates the color balance factors on the basis of the polarization properties of the specific color and those of the non-specific colors. The color balance factor calculating section 36 outputs the color balance factors based on the calculated polarization properties to the color balance factor adjusting section 37.

The color balance factor adjusting section 37 adjusts the color balance factors using the color balance factors based on the color information and the color balance factors based on the polarization properties and calculated by the color balance factor calculating section 36, thereby generating the adjusted color balance factors.

For example, the color balance factor adjusting section 37 calculates a difference absolute value between a red color balance factor $g_{R1}$ based on the color information on one hand and a red color balance factor $g_{R2}$ based on the polarization properties and calculated by the color balance factor calculating section 36 on the other hand. In the case where the difference absolute value falls within a threshold value, the color balance factor adjusting section 37 considers the red color balance factor $g_{R2}$ based on the polarization properties to be an adjusted color balance factor $g_R$. Where the difference absolute value exceeds the threshold value, the color balance factor adjusting section 37 considers the red color balance factor $g_{R1}$ based on the color information to be the adjusted color balance factor $g_R$. Further, the color balance factor adjusting section 37 performs similar processing on the color blue, thereby setting the adjusted color balance factor $g_B$ in a similar manner.

The adjusted color balance factors are generated on the basis of polarization properties by the above-described processing even in the case where the illumination light source is unknown or where no white subject is included in imaging regions. In addition, in the case where the accuracy of the color balance factors based on the polarization properties is lowered due to a reduced specular reflection component, the color balance factors based on the color information are used as the adjusted color balance factors, so that the accuracy of the adjusted color balance factors is prevented from dropping significantly.

Preferably, the color balance factor adjusting section 37 may use average values of the color balance factors based on the color information and of the color balance factors based on the polarization properties, as the adjusted color balance factors.

Furthermore, the color balance factor adjusting section 37 may set a blending ratio α while setting the adjusted color balance factor $g_R$ for the color red as indicated in the following expression (19):

$$g_R = (1-\alpha)g_{R1} + \alpha g_{R2} \quad (19)$$

The color balance factor adjusting section 37 may similarly set the adjusted color balance factor for the color blue.

In such case, as the blending ratio α becomes closer to 1, the proportion of the color balance factors based on the polarization properties becomes higher. The blending ratio α may be set according to specular reflection, for example. As the amount of specular reflection becomes larger, the blending ratio α is brought closer to 1 because the reliability of the color balance factors based on the polarization properties is considered high. For example, the blending ratio α is calculated using an amount of specular reflection s and a saturation level Dmax of the pixel signals, as indicated by the following expression (20):

$$a = s/D\max \quad (20)$$

The color balance adjusting section 38 performs gain adjustment on the unpolarized and polarized images of the non-specific colors, using the adjusted color balance factors generated by the color balance factor adjusting section 37.

By so doing, the color balance adjusting section 38 generates the white balance-adjusted unpolarized component image signal of each color and the white balance-adjusted polarized component image signal of each color in each polarization direction.

Preferably, the color balance factor adjusting section 37 may present the user with the color balance factors based on the color information and with the color balance factors based on the polarization properties and calculated by the color balance factor calculating section 36. By so doing, the color balance factor adjusting section 37 may generate the adjusted color balance factors as designated by the user.

Figure 22:
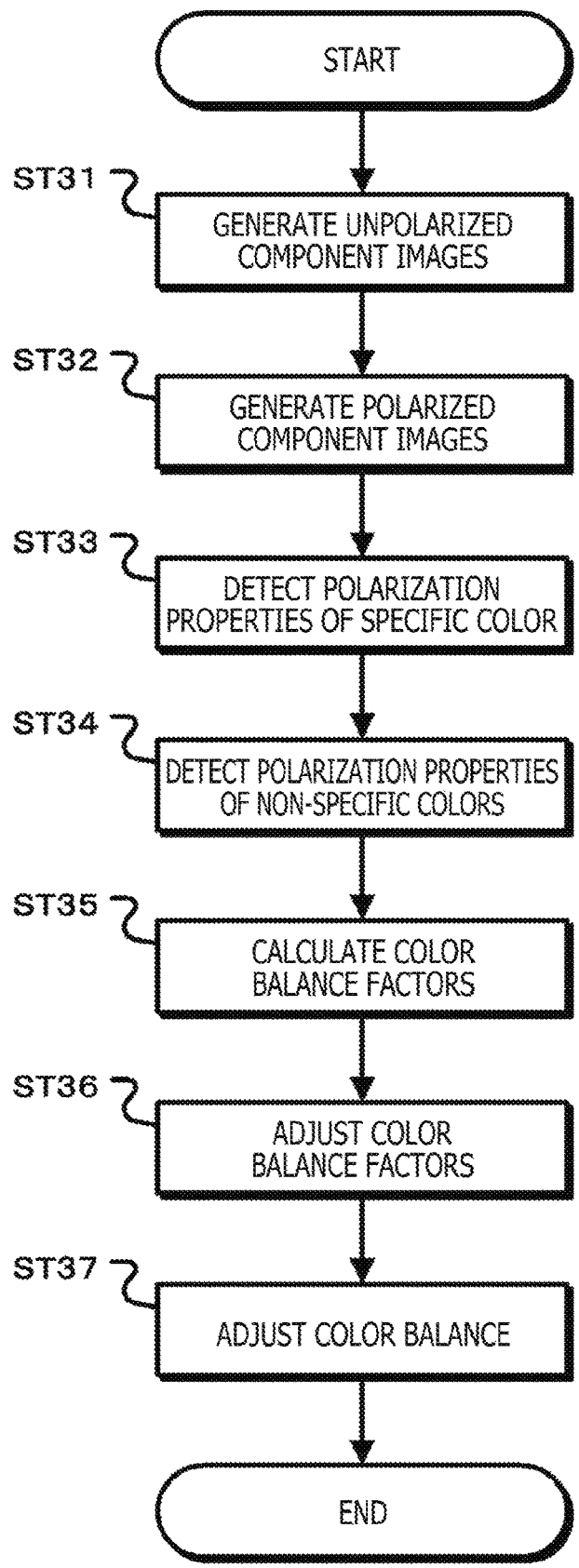
FIG. 22 is a flowchart depicting the operations of the fifth embodiment.

FIG. 22 is a flowchart depicting the operations of the fifth embodiment. In step ST31, the image processing apparatus generates unpolarized component images. The image processing apparatus 30-5 generates the unpolarized component image signal of each color by performing the filtering process using the signals of the unpolarized pixels of the same color out of the image signals of the polarized RAW image supplied from the solid-state imaging apparatus 20. The image processing apparatus 30-5 then goes to step ST32.

In step ST32, the image processing apparatus generates polarized component images. The image processing apparatus 30-5 generates the polarized component image signal of each color in each polarization direction by performing the filtering process using the signals of the polarized pixels of the same color in the same polarization direction out of the image signals of the polarized RAW image supplied from the solid-state imaging apparatus 20. The image processing apparatus 30-5 then goes to step ST33.

In step ST33, the image processing apparatus detects the polarization properties of the specific color. The image processing apparatus 30-5 detects the polarization properties of the specific color on the basis of the polarized component image signal of the specific color generated in step ST32 and the unpolarized component image signal of the specific color generated in step ST31. The image processing apparatus 30-5 then goes to step ST34.

In step ST34, the image processing apparatus detects the polarization properties of the non-specific colors. The image processing apparatus 30-5 detects the polarization properties of the non-specific colors on the basis of the polarization properties of the specific color detected in step ST33, the unpolarized component image signal of the non-specific colors generated in step ST31, and the polarized component image signal of the non-specific colors generated in step ST32. The image processing apparatus 30-5 then goes to step ST35.

In step ST35, the image processing apparatus calculates color balance factors. The image processing apparatus 30-5 calculates, as the color balance factors, the gains that equalize the amplitude of the polarization properties of the non-specific colors to the amplitude of the polarization properties of the specific color, on the basis of the polarization properties of the specific color detected in step ST33 and the polarization properties of the non-specific colors detected in step ST34. The image processing apparatus 30-5 then goes to step ST36.

In step ST36, the image processing apparatus adjusts the color balance factors. The image processing apparatus 30-5 generates the adjusted color balance factors using the color balance factors based on the color information and the color balance factors based on the polarization properties and calculated in step ST35. The image processing apparatus 30-5 then goes to step ST37.

In step ST37, the image processing apparatus performs color balance adjustment. The image processing apparatus 30-5 performs gain adjustment on the unpolarized component image signal of the non-specific colors generated in step ST31, through the use of the adjusted color balance factors generated in step ST36. Preferably, the image processing apparatus 30-5 may perform gain adjustment on the polarized component image signal of the non-specific colors generated in step ST32, using the adjusted color balance factors generated in step ST36.

The above-described fifth embodiment, as with the first embodiment, permits highly accurate detection of the polarization properties of each color even in the case where the degree of polarization varies from one color to another. Also, the polarized pixels of the non-specific colors are allowed to have fewer polarization directions than the polarized pixels of the specific color, so that the deterioration of image quality due to the polarized pixels being configured is reduced. Furthermore, because the color balance factors are calculated on the basis of the polarization properties, it is possible to obtain the image signals having undergone highly accurate white balance adjustment even in the case where the illumination light source is unknown or where no white subject is included in imaging regions. Also, in the case where the accuracy of the color balance factors based on the polarization properties is lowered due to a reduced specular reflection component, the color balance factors based on the color information are used to perform highly accurate white balance adjustment.

6. Other Embodiments

The image signals for use by the image processing apparatus are not limited to those generated by the solid-state imaging apparatus having the above-described pixel arrays. For example, the solid-state imaging apparatus may have the pixel arrays such as those to be discussed in the ensuing paragraphs, "7. Other configurations of the solid-state imaging apparatus." Further, the pixel colors are not limited to the primary colors and may include complementary colors.

Whereas the above-described embodiments are configured to output the polarization properties of the specific and non-specific colors as well as the polarized and unpolarized component image signals of the specific and non-specific colors, other embodiments may be configured to output only the polarization properties. In addition, although the fourth and fifth embodiments are configured to output the white balance-adjusted image signals, other embodiments may be configured to output the color balance factors and the image signals yet to undergo white balance adjustment. Further, the filtering processes are not limited to those explained above in connection with the corresponding embodiments and may be switched between the embodiments. For example, the filtering process performed by the second embodiment in generating the polarized and unpolarized images may be used by the first embodiment in generating the polarized and unpolarized images. Also, the polarization properties of the specific and non-specific colors may be detected more accurately by carrying out the filtering process in a manner generating unpolarized and polarized component image signals offering better image quality than that provided by the above-described embodiments.

Further, the above-described flowcharts depicting the operations are not limited to the sequential processing in which the steps in the flowcharts are executed successively. For example, the generation of unpolarized images and that of polarized images may be carried out one after another or in parallel with each other. As another example, pipeline processing may be performed so that every time a pixel signal necessary for the processing is obtained, the filtering process and polarization property calculation may be carried out on each pixel.

7. Other Configurations of the Solid-State Imaging Apparatus

The solid-state imaging apparatus 20 is not limited to the configurations involving the pixel arrays depicted in FIG. 3 or in FIG. 15 in which the signals of the pixels are read out sequentially. The solid-state imaging apparatus is explained below in conjunction with other configurations focusing on the pixel arrays and pixel signal readout.

7-1. Pixel Arrays

The pixel array of the solid-state imaging apparatus 20 is only required to have the pixels of the specific color configured to permit detection of polarization properties, and the pixels of non-specific colors different from the specific color that are constituted by unpolarized pixels and by the polarized pixels of the non-specific colors having fewer polarization directions than the polarized pixels of the specific color, as discussed above.

FIGS. 23A, 23B, 23C, 23D, 23E, 23F, 24A, 24B, 24C, 24D, and 24E depicts exemplary partial pixel arrays (4×4-pixel array repeat units). FIG. 23A includes 2×2 color pixel regions each having the specific color of green and constituted by pixels polarized in four different polarization directions. Also included are 2×2 color pixel regions each having the non-specific colors of red and blue and constituted by one pixel polarized in one polarization direction and three unpolarized pixels.

FIG. 23B includes 2×2 color pixel regions each having the specific color of green and constituted by pixels polarized in three different polarization directions and one unpolarized pixel. Also included are 2×2 color pixel regions each having the non-specific colors of red and blue and constituted by one pixel polarized in one polarization direction and three unpolarized pixels.

FIG. 23C includes 2×2 color pixel regions each having the specific color of green and constituted by two pixels polarized in two different polarization directions and two unpolarized pixels. Also included are 2×2 color pixel regions each having the non-specific colors of red and blue and constituted by one pixel polarized in one polarization direction and three unpolarized pixels.

Further, FIGS. 23D, 23E, and 23F depicts 4×4 pixel array repeat units including two color region units of the specific color as an example in which only one of the two color region units has polarized pixels.

Even when the solid-state imaging apparatus 20 is configured to have the pixel arrays as illustrated in FIGS. 23A, 23B, 23C, 23D, 23E, and 23F the image processing apparatus detects the polarization properties of each color with high accuracy by performing the above-described processing. The image processing apparatus thus configured further obtains the unpolarized and polarized images of each color.

The pixel arrays may also be configured as depicted in FIGS. 24A, 24B, 24C, 24D, and 24E. FIG. 24A depicts an example in which green and red are the specific colors and blue is the non-specific color. FIG. 24B illustrates an exemplary pixel array of which the color region unit is one pixel. FIGS. 24C and 24D depict examples in which the pixels of the three primary colors (red, green, and blue) are supplemented with white pixels. In such case, white is the specific color and red, green, and blue are the non-specific colors. Preferably, instead of only the white pixels, there may be provided pixels that are sensitive to the infrared region. Also, as depicted in FIG. 24E, the pixel array may be configured to be inclined at 45 degrees.

As described above, the pixel array of the solid-state imaging apparatus 20 is only required to be configured to be capable of calculating the polarization properties of the specific color and to have the polarized pixels of the non-specific colors having fewer polarization directions than the polarized pixels of the specific color as well as the unpolarized pixels.

7-2. Signal Readout

Incidentally, the polarized pixels, when furnished with polarizers, have lower sensitivity than the unpolarized pixels. Thus, the first embodiment detects polarization properties using a gain K that absorbs the difference in sensitivity between the pixels. What follows is an explanation of an otherwise-configured solid-state imaging apparatus that generates pixel signals with no difference in sensitivity between unpolarized and polarized pixels.

Figure 25:
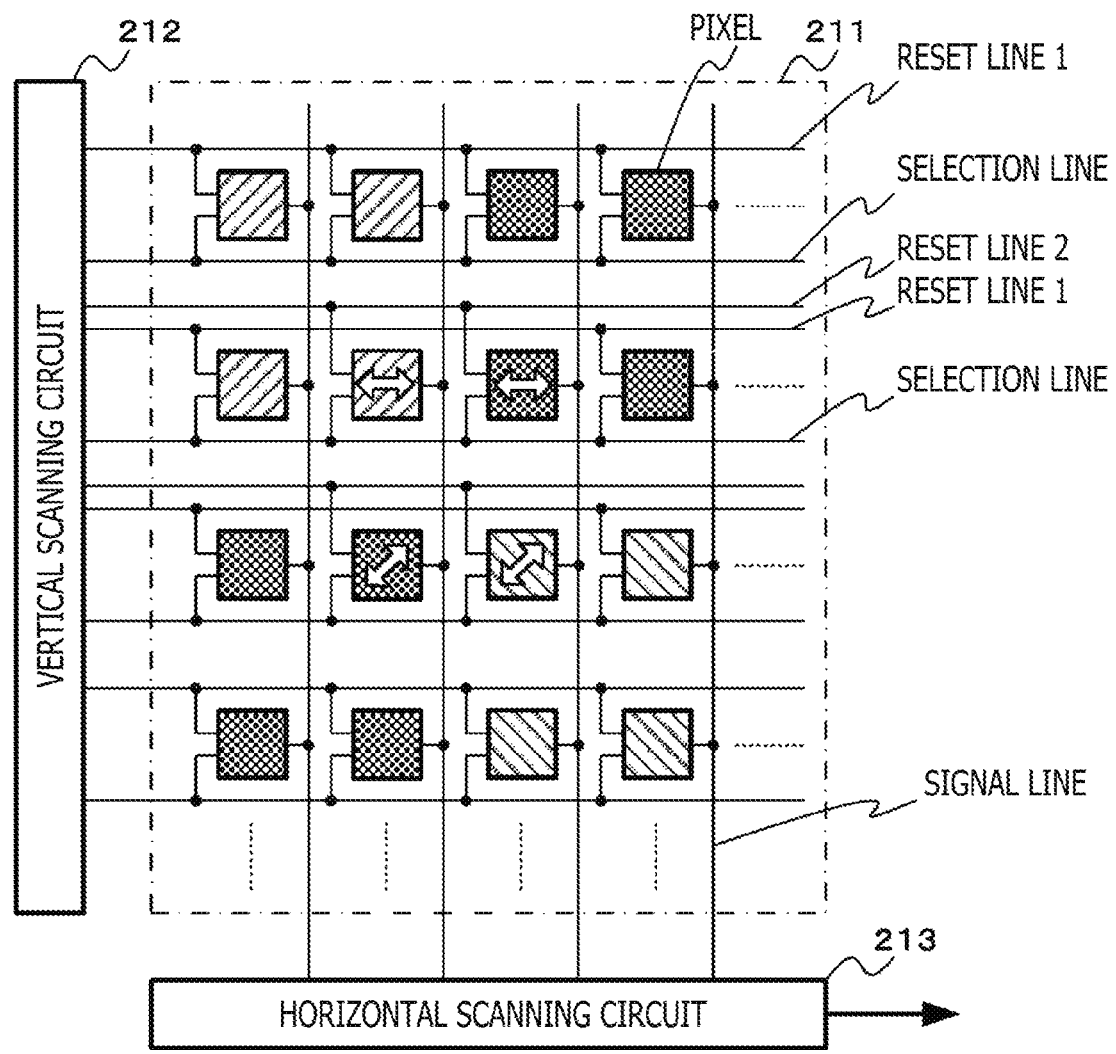
FIG. 25 is a view depicting an exemplary pixel configuration of the solid-state imaging apparatus.

FIG. 25 depicts an exemplary pixel configuration of the solid-state imaging apparatus. An image sensor 21 includes a pixel array section 211 having multiple pixels arrayed in a two-dimensional matrix, for example, as well as a vertical scanning circuit 212 and a horizontal scanning circuit 213 for controllably driving the pixel array 211. Note that, for the purpose of simplified explanation, only some of the pixels in the row and column directions are indicated in the pixel array section 211. In addition, the pixels of the pixel array section 211 are presented together with their pixel colors and polarization directions in the drawing.

The pixels of the pixel array section 211 each include a photodiode, a charge transfer transistor, and a reset transistor, though not depicted. Each pixel is connected with the vertical scanning circuit 212 via a reset line and a selection line and with the horizontal scanning circuit 213 via a signal line.

The vertical scanning circuit 212 outputs a reset signal via the reset line of a given polarized pixel to the reset transistor of that polarized pixel, causing the latter to discharge an electrical charge accumulated therein. The vertical scanning circuit 212 also outputs a reset signal via the reset line of a given unpolarized pixel to the reset transistor of that unpolarized pixel, causing the latter to discharge an electrical charge accumulated therein. Thereafter, the vertical scanning circuit 212 outputs a readout signal via the selection line to the charge transfer transistors of the polarized and unpolarized pixels, causing these pixels to output the electrical charges accumulated therein during an exposure period ranging from the time the reset signal is output to the time the readout signal is output, the electrical charges being output onto the signal line as a signal current. The horizontal scanning circuit 213 performs processes of converting the signal current read out from each pixel into a digital pixel signal and of performing noise reduction thereon. The horizontal scanning circuit 213 outputs the pixel signal thus processed to the image processing apparatus 30 in the order of the pixels in the horizontal direction. Also, the vertical scanning circuit 212 and the horizontal scanning circuit 213 perform the above-described processing one line after another. Further, the vertical scanning circuit 212 controls the exposure period of the polarized or unpolarized pixels in a manner causing these pixels to match in sensitivity. For example, the vertical scanning circuit 212 controls the timing of the reset signal for the unpolarized pixels to adjust their exposure period in such a manner that the unpolarized and polarized pixels match in sensitivity.

FIGS. 26A, 26B, 26C, 26D, and 26E are views for explaining the operations of the image sensor in the solid-state imaging apparatus. The solid-state imaging apparatus 20 independently controls the output of a polarized pixel reset signal and the output of an unpolarized pixel reset signal. By so doing, the solid-state imaging apparatus 20 adjusts the exposure period of the unpolarized pixels in such a manner that when an unpolarized image of the subject is acquired, the signal level of the polarized pixels becomes equal to that of the unpolarized pixels.

Figure 26:
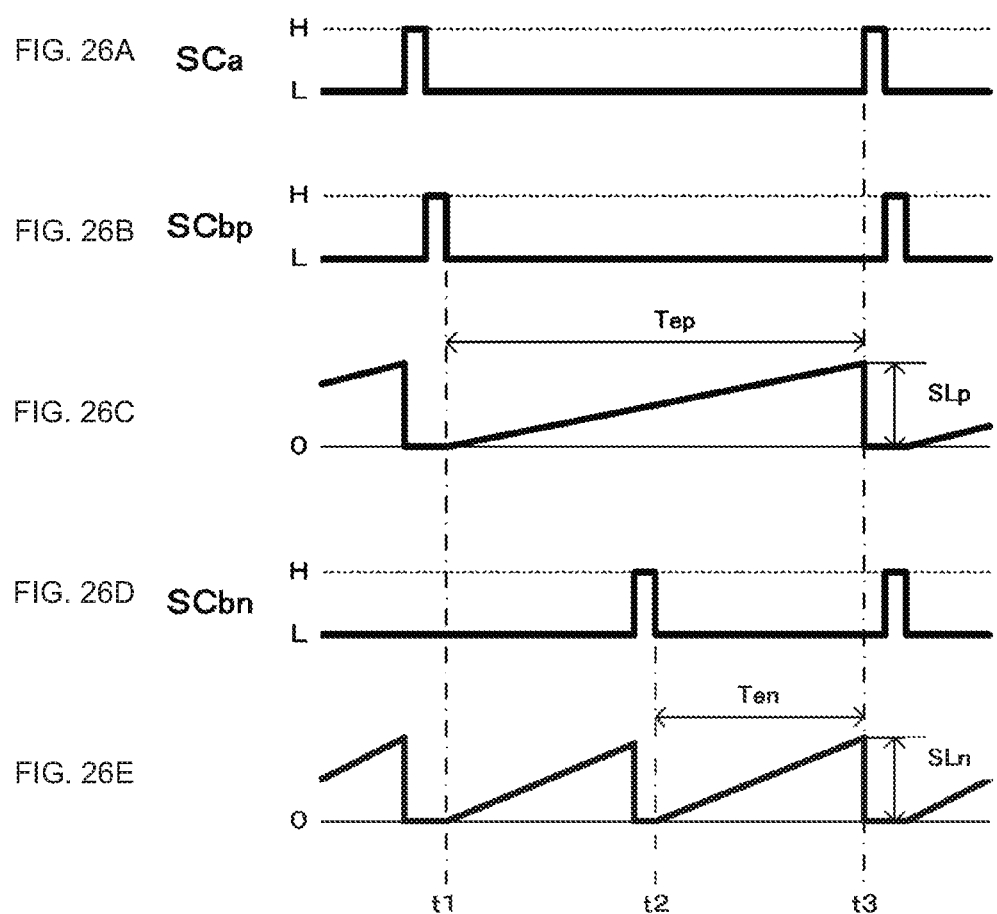
FIGS. 26A, 26B, 26C, 26D, and 26E are views for explaining the operations of an image sensor in the solid-state imaging apparatus.

FIG. 26A depicts a readout signal SCa for reading out the signal reflecting the electrical charge accumulated in a polarized or unpolarized pixel. FIG. 26B indicates a reset signal SCbp for a polarized pixel. FIG. 26C illustrates an amount of electrical charge accumulated in a polarized pixel. Given the reset signal SCbp, the polarized pixel discharges the accumulated electrical charge, before accumulating an electrical charge reflecting incident light starting from a time point t1 at which the reset signal SCbp is terminated.

FIG. 26D depicts a reset signal SCbn for an unpolarized pixel, and FIG. 26E illustrates an amount of electrical charge accumulated in the unpolarized pixel. Given the reset signal SCbn, the unpolarized pixel discharges the accumulated electrical charge, before accumulating an electrical charge reflecting incident light starting from a time point t2 at which the reset signal SCbn is terminated.

Given the read signal SCa, the polarized pixels and the unpolarized pixels have their accumulated electrical charges read out at a time point t3. That is, the period ranging from time point t1 to time point t3 is an exposure time Tep for the polarized pixel, and the period ranging from time point t2 to time point t3 is an exposure time Ten for the unpolarized pixel. Thus, when the exposure time Ten is made shorter than the exposure time Tep in keeping with the sensitivity of the unpolarized pixel relative to the polarized pixel, it is possible to generate an image signal such that a signal level SLp of the polarized pixel becomes equal to a signal level SLn of the unpolarized pixel despite the difference in sensitivity between the polarized pixels and the unpolarized pixels.

Preferably, the solid-state imaging apparatus 20 may perform gain adjustment on the pixel signal in such a manner that the polarized pixels and the unpolarized pixels match in sensitivity in the horizontal scanning circuit 213.

The above-described solid-state imaging apparatus is thus capable of generating the image signal of an imaged image with no difference in sensitivity between the polarized pixels and the unpolarized pixels. This eliminates the need for the image processing apparatus to take into consideration the difference in sensitivity between the polarized pixels and the unpolarized pixels, allowing the image processing apparatus to detect the polarization properties easily.

Incidentally, in the case where the solid-state imaging apparatus is configured to incorporate a CMOS image sensor, the solid-state imaging apparatus permits interpolation readout of pixel signals. In addition, in the case of interpolation readout of the pixel signals, it is possible to read the pixel signals at a high frame rate and to thereby improve the S/N ratio of the pixel signals.

Below is an explanation of the case where the solid-state imaging apparatus performs interpolation readout of signals from pixels. FIGS. 27A and 27B depict pixels and readout signal lines of the solid-state imaging apparatus. FIG. 27A depicts a portion of an exemplary pixel array of the solid-state imaging apparatus 20. In addition, FIG. 27B illustrates readout signal lines. The pixels of the solid-state imaging apparatus 20 each include a photodiode, a charge transfer transistor, and a reset transistor, though not depicted. Given the reset signal to drive the reset transistor, each pixel discharges the electrical charge accumulated therein. Thereafter, given the readout signal to drive the charge transfer transistor, each pixel outputs, as a pixel signal, the electrical charge accumulated therein during the exposure period ranging from the time the reset is terminated to the time the readout is started, the pixel signal being output onto the readout signal line. The readout signal lines are connected with an analog/digital conversion (A/D) section.

The analog/digital conversion (A/D) section converts an analog pixel signal read out from each pixel into a digital pixel signal and, after performing noise reduction, outputs the digital pixel signal to the image processing apparatus 30.

FIGS. 28A, 28B, 28C, 28D, 28E, and 28F are views for explaining the operations of reading out the pixel signals. The solid-state imaging apparatus 20 interpolatively reads out the pixel signals sequentially from the pixels having the same color and the same polarization direction out of the pixels of the same column connected with the same readout signal line. FIG. 28A depicts a portion of an exemplary pixel array of the solid-state imaging apparatus 20. For example, as illustrated in FIG. 28B, the solid-state imaging apparatus 20 interpolatively reads out the pixel signals from two unpolarized red pixels via a readout signal line VSL0 so as to generate a digital pixel signal of one unpolarized red pixel. Also, the solid-state imaging apparatus 20 interpolatively reads out the pixel signals from two unpolarized red pixels via a readout signal line VSL1 so as to generate a digital pixel signal of one unpolarized red pixel. Further, the solid-state imaging apparatus 20 interpolatively reads out the pixel signals from two unpolarized green pixels via a readout signal line VSL2 so as to generate a digital pixel signal of one unpolarized green pixel. Furthermore, the solid-state imaging apparatus 20 interpolatively reads out the pixel signals from two unpolarized green pixels via a readout signal line VSL3 so as to generate a digital pixel signal of one unpolarized green pixel. In such manner, the solid-state imaging apparatus 20 generates the pixel signals of one line.

The solid-state imaging apparatus 20 then generates the pixel signals of the next line. For example, as depicted in FIG. 28C, the solid-state imaging apparatus 20 interpolatively reads out the pixel signals from two unpolarized red pixels via the readout signal line VSL0 so as to generate a digital pixel signal of one unpolarized red pixel. Also, the solid-state imaging apparatus 20 interpolatively reads out the pixel signals from two polarized red pixels (with the transmission axis at an angle of 90 degrees) via the readout signal line VSL1 so as to generate a digital pixel signal of one polarized red pixel (with the transmission axis at the angle of 90 degrees). Further, the solid-state imaging apparatus 20 interpolatively reads out the pixel signals from two polarized green pixels (with the transmission axis at the angle of 90 degrees) via the readout signal line VSL2 so as to generate a digital pixel signal of one polarized green pixel (with the transmission axis at the angle of 90 degrees). Furthermore, the solid-state imaging apparatus 20 interpolatively reads out the pixel signals from two unpolarized green pixels via the readout signal line VSL3 so as to generate a digital pixel signal of one polarized green pixel.

In such manner, the solid-state imaging apparatus 20 generates the pixel signals of another line.

Moreover, as depicted in FIGS. 28D and 28E, for example, the solid-state imaging apparatus 20 interpolatively reads out the pixel signals from two unpolarized pixels via the readout signal lines VSL0 to VSL3 so as to generate a digital pixel signal of one unpolarized pixel, and interpolatively reads out the pixel signals from two polarized pixels in the same polarization direction via the readout signal lines VSL0 to VSL3 so as to generate a digital pixel signal of one polarized pixel. In such manner, the solid-state imaging apparatus 20 successively shifts the pixel as the target for signal interpolation in the vertical direction, thereby generating the pixel signals of each line. Consequently, the image signals output from the solid-state imaging apparatus 20 have half the resolution in the vertical direction, as depicted in FIG. 28F. In such case, the image processing apparatus may perform processes to reduce the resolution in the horizontal direction by half so that the aspect ratio of the output image will remain unchanged.

By interpolatively reading out the pixels as described above, the solid-state imaging apparatus 20 can output the image signals of the polarized RAW image with a high frame rate and a high S/N ratio to the image processing apparatus 30-1 (30-2 to 30-5).

8. Usage Examples

The technology of the present disclosure may be applied to diverse products. For example, the technology of the present disclosure may be implemented as an apparatus to be mounted on any one of such mobile objects as automobiles, electric vehicles, hybrid electric vehicles, motorcycles, bicycles, personal mobility devices, aircraft, drones, ships, and robots.

Figure 29:
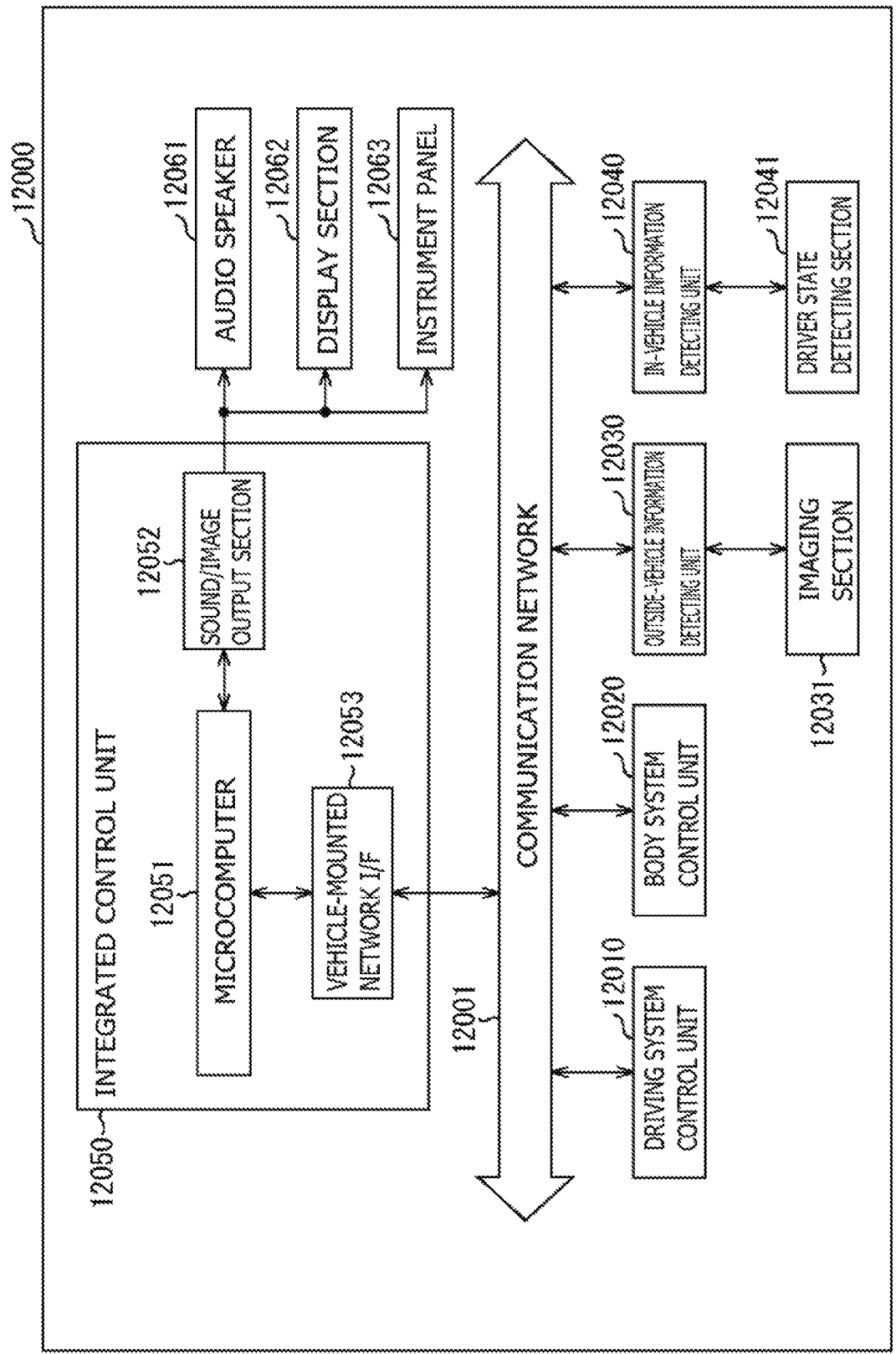
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
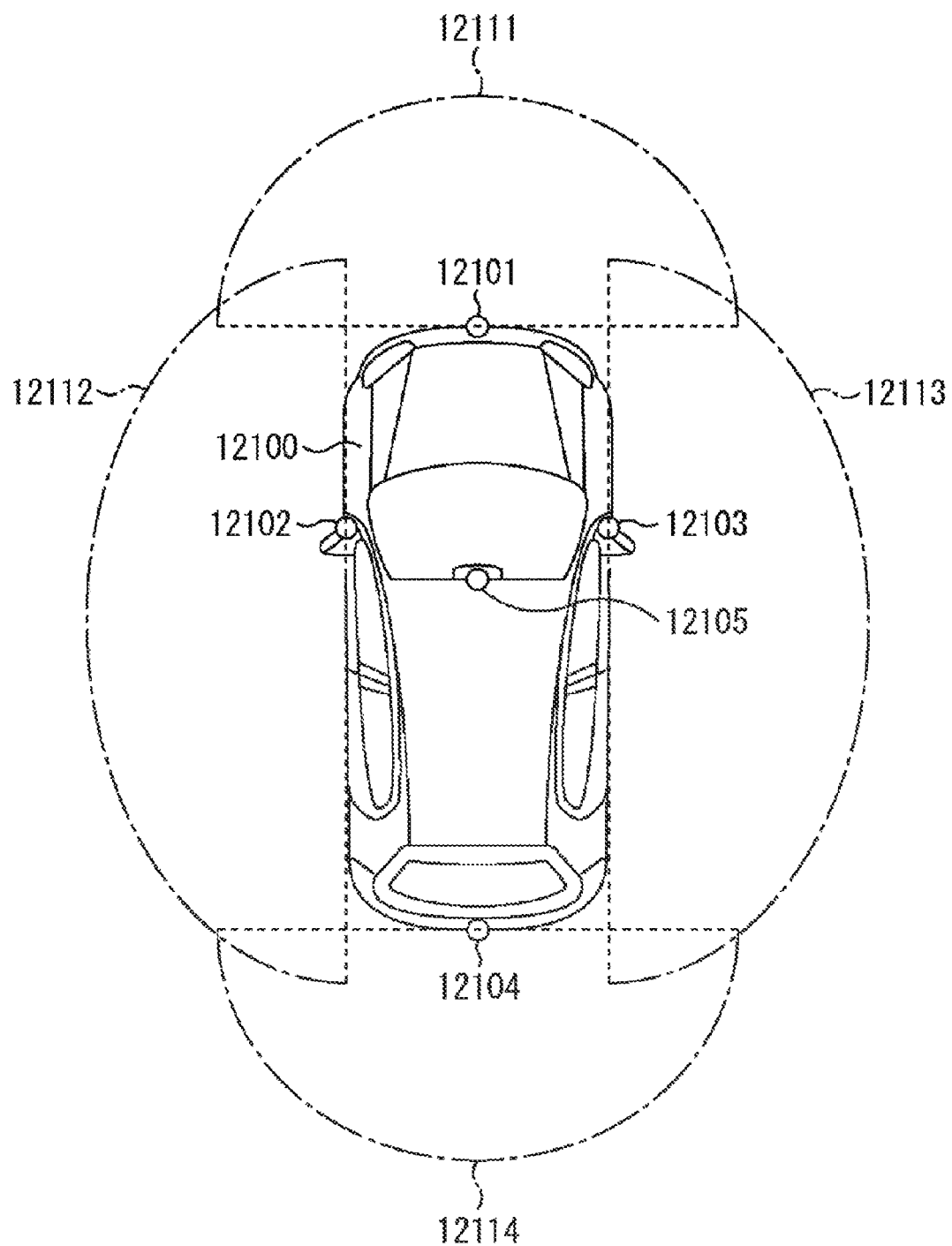
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Explained above was an exemplary vehicle control system to which the technology of the present disclosure may be applied. The solid-state imaging apparatus 20 according to the technology of the present disclosure may be used as the imaging section 12031 among the components explained above. Further, the image processing apparatus 30 of the technology of the present disclosure may be used as the outside-vehicle information detecting unit 12030 among the above-described components. Applying the technology of the present disclosure to the vehicle control system enables the latter to obtain the polarization properties of each color with high accuracy. By allowing reflection to be removed and the shape of the subject to be recognized three-dimensionally, the technology provides highly accurate acquisition of the information required for reducing the driver's fatigue and for achieving automated driving.

The series of the processes described above may be executed by hardware, by software, or by a combination of both. Where the software-based processing is to be carried out, the programs recording the process sequences involved are installed into an internal memory of a computer in dedicated hardware for program execution. Alternatively, the programs may be installed into a general-purpose computer capable of performing diverse processes for execution of the programs.

For example, the programs may be recorded beforehand on a hard disc, an SSD (Solid State Drive), or a ROM (Read Only Memory) serving as a recording medium. Alternatively, the programs may be stored (recorded) temporarily or permanently on a removable recording medium such as a flexible disc, a CD-ROM (Compact Disc Read Only Memory), an MO (Magneto optical) disc, a DVD (Digital Versatile Disc), a BD (Blu-Ray Disc (registered trademark)), a magnetic disc, or a semiconductor memory card. Such removable recording mediaŸum may be offered as what is generally called packaged software.

Besides being installed into the computer from the removable recording medium, the programs may also be transferred in wired or wireless fashion from a download site to the computer via networks such as a LAN (Local Area Network) or the Internet. The computer may receive the programs thus transferred and have them installed onto an internal recording medium such as a hard disc.

The advantageous effects stated in the present description are only examples and are not limitative of the present technology. There may be additional advantageous effects derived from and not covered by the present description. The present technology should not be limited to the embodiments discussed above when interpreted. The embodiments are presented only as illustrations in disclosing the present technology. It is evident that many alternatives, modifications, and variations of the embodiments will become apparent to those skilled in the art without departing from the spirit and scope of the present technology. Accordingly, the scope of the present technology should be determined in consideration of the appended claims and their legal equivalents, rather than by the examples given.

The present disclosure may also be implemented preferably in the following configurations.

(1)

An image processing apparatus including:

a non-specific color polarization property detecting section configured to detect polarization properties of a non-specific color on the basis of polarization properties of a specific color, pixel signals of unpolarized pixels of the non-specific color different from the specific color, and pixel signals of polarized pixels of the non-specific color having fewer polarization directions than polarized pixels of the specific color.

(2)

The image processing apparatus as stated in paragraph (1) above, in which the non-specific color polarization property detecting section detects the polarization properties of the non-specific color on the assumption that an azimuth angle of the specific color is equal to an azimuth angle of the non-specific color.

(3)

The image processing apparatus as stated in paragraph (2) above, in which the non-specific color polarization property detecting section calculates a degree of polarization of the non-specific color on the basis of the polarization properties of the specific color, the pixel signals of the unpolarized pixels of the non-specific color, and the pixel signals of the polarized pixels of the non-specific color having fewer polarization directions than the polarized pixels of the specific color.

(4)

The image processing apparatus as stated in any one of paragraphs (1) to (3) above, further including:

a specific color polarization property detecting section configured to detect the polarization properties of the specific color, using pixel signals of polarized or unpolarized pixels of the specific color having at least three polarization directions and pixel signals of polarized pixels having two polarization directions.

(5)

The image processing apparatus as stated in any one of paragraphs (1) to (4) above, further including:

an unpolarized component image generating section configured to generate an unpolarized component image signal of the specific color, using pixel signals of polarized pixels or unpolarized pixels of the specific color, and an unpolarized component image signal of the non-specific color, using the pixel signals of the unpolarized pixels of the non-specific color; and a polarized component image generating section configured to generate a polarized component image signal of the specific color, using the pixel signals of the polarized pixels of the specific color, and a polarized component image signal of the non-specific color, using the pixel signals of the polarized pixels of the non-specific color.

(6)

The image processing apparatus as stated in paragraph (5) above, in which the unpolarized component image generating section and the polarized component image generating section respectively generate the unpolarized component image signal and the polarized component image signal by performing a filtering process using pixel signals of pixels having the same color and the same polarization direction.

(7)

The image processing apparatus as stated in paragraph (6) above, in which the unpolarized component image generating section and the polarized component image generating section generate a pixel signal of a target pixel position for each color and for each polarization direction on the basis of a low-frequency component and a high-frequency component of the target pixel position, the low-frequency component of the pixel target position being calculated for each color and for each polarization direction by performing the filtering process using pixels surrounding the target pixel position and having a color and a polarization direction same as those of a pixel of the target pixel position, the high-frequency component of the target pixel position being calculated using the pixel signal of the target pixel position and the low-frequency component of the target pixel position having the color and the polarization direction same as those of the pixel of the target pixel position.

(8)

The image processing apparatus as stated in any one of paragraphs (5) to (7) above, in which the pixel signals of the polarized pixels and the unpolarized pixels of the specific color and the non-specific color include signals having undergone white balance adjustment.

(9)

The image processing apparatus as stated in any one of paragraphs (5) to (7) above, further including:

a color balance factor calculating section configured to calculate color balance factors on the basis of the polarization properties of the specific color and the polarization properties of the non-specific color.

(10)

The image processing apparatus as stated in paragraph (9) above, in which the color balance factor calculating section calculates the color balance factors by assuming that specular reflection is white.

(11)

The image processing apparatus as stated in paragraph (9) or (10) above, further including:

a color balance adjusting section configured to perform white balance adjustment on either the unpolarized component image signal or the polarized component image signal, using the color balance factors calculated by the color balance factor calculating section.

(12)

The image processing apparatus as stated in paragraph (11) above, further including:

a color balance factor adjusting section configured to adjust the color balance factors according to the color balance factors calculated by the color balance factor calculating section and based on the polarization properties and the color balance factors based on color information for reproducing the color white of a white subject, in which the color balance adjusting section performs the white balance adjustment using the color balance factors adjusted by the color balance factor adjusting section.

(13)

The image processing apparatus as stated in paragraph (12) above, in which the color balance factor adjusting section adjusts the color balance factors on the basis of either an amount of difference between the color balance factors based on the polarization properties on one hand and the color balance factors based on the color information on the other hand, or an amount of specular reflection.

INDUSTRIAL APPLICABILITY

According to the image processing apparatus, image processing method, program, and solid-state imaging apparatus of the present technology, the polarization properties of non-specific colors are detected on the basis of the polarization properties of the specific color, the pixel signals of the unpolarized pixels of the non-specific colors different from the specific color, and the pixel signals of the polarized pixels of the non-specific colors having fewer polarization directions than the polarized pixels of the specific color. This makes it possible to detect the polarization properties of each color with high accuracy. Thus, the image processing apparatus, image processing method, program, and solid-state imaging apparatus of the present technology may be applied advantageously to equipment that performs control using polarization information, such as the vehicle control system.

REFERENCE SIGNS LIST 10-1 to 10-5 . . . Imaging system
20 . . . Solid-state imaging apparatus
21 . . . Image sensor
22 . . . Color mosaic filter
23 . . . Polarizer
30-1 to 30-5 . . . Image processing apparatus
31 . . . Polarized component dividing section
32-1 to 32-5 . . . Unpolarized component image generating section
33-1 to 33-5 . . . Polarized component image generating section
34-1 to 34-5 . . . Specific color polarization property detecting section
35 . . . Non-specific color polarization property detecting section
36 . . . Color balance factor calculating section
37 . . . Color balance factor adjusting section
38 . . . Color balance adjusting section

The invention claimed is:

1. An image processing apparatus, comprising:
circuitry configured to:
detect polarization properties of a non-specific color based on polarization properties of a specific color, pixel signals of unpolarized pixels of the non-specific color, pixel signals of polarized pixels of the non-specific color, and an azimuth angle of the specific color is equal to an azimuth angle of the non-specific color, wherein
the non-specific color is different from the specific color, and
the polarized pixels of the non-specific color have fewer polarization directions than polarized pixels of the specific color.

2. The image processing apparatus according to claim 1, wherein the circuitry is further configured to calculate a degree of polarization of the non-specific color based on the polarization properties of the specific color, the pixel signals of the unpolarized pixels of the non-specific color, and the pixel signals of the polarized pixels of the non-specific color.

3. The image processing apparatus according to claim 1, wherein the circuitry is further configured to detect the polarization properties of the specific color based on pixel signals of polarized pixels of the specific color having at least two polarization directions and pixel signals of unpolarized pixels of the specific color.

4. The image processing apparatus according to claim 1, wherein the circuitry is further configured to:
generate an unpolarized component image signal of the specific color based on pixel signals of unpolarized pixels of the specific color, and an unpolarized component image signal of the non-specific color based on the pixel signals of the unpolarized pixels of the non-specific color; and
generate a polarized component image signal of the specific color based on pixel signals of polarized pixels of the specific color, and a polarized component image signal of the non-specific color based on the pixel signals of the polarized pixels of the non-specific color.

5. The image processing apparatus according to claim 4, wherein the circuitry is further configured to:
execute a first filtering process on pixel signals of a first plurality of pixels, wherein each of the first plurality of pixels has a same color and a same polarization direction, and
generate the unpolarized component image signal and the polarized component image signal based on the first filtering process.

6. The image processing apparatus according to claim 5, wherein the circuitry is further configured to:
execute a second filtering process on pixel signals of a second plurality of pixels, wherein
the second plurality of pixels is in a periphery of a target pixel position, and each of the second plurality of pixels has a color and a polarization direction identical to a pixel of the target pixel position;

calculate a low-frequency component of the target pixel position for each color and for each polarization direction based on the second filtering process;

calculate a high-frequency component of the target pixel position based on a first pixel signal of the target pixel position and the calculated low-frequency component of the target pixel position; and generate a second pixel signal of the target pixel position for each color and for each polarization direction based on the low-frequency component and the high-frequency component of the target pixel position.

7. The image processing apparatus according to claim 4, wherein the pixel signals of the polarized pixels and the unpolarized pixels of the specific color and the non-specific color include signals with white balance adjustment.

8. The image processing apparatus according to claim 4, wherein the circuitry is further configured to calculate a first color balance factor based on the polarization properties of the specific color and the polarization properties of the non-specific colors.

9. The image processing apparatus according to claim 8, wherein the circuitry is further configured to calculate the first color balance factor based on white specular reflection.

10. The image processing apparatus according to claim 8, wherein the circuitry is further configured to execute white balance adjustment on one of the unpolarized component image signal or the polarized component image signal based on the calculated first color balance factor.

11. The image processing apparatus according to claim 10, wherein the circuitry is further configured to:
adjust a third color balance factor based on the calculated first color balance factor, the polarization properties, and a second color balance factor, wherein the second color balance factor is based on color information for reproducing a color white of a white subject, and
execute the white balance adjustment based on the adjusted third color balance factor.

12. The image processing apparatus according to claim 11, wherein the circuitry is further configured to adjust the third color balance factor based on one of an amount of difference between the first color balance factor and the second color balance factor or an amount of specular reflection.

13. An image processing method, comprising:
detecting polarization properties of a non-specific color based on polarization properties of a specific color, pixel signals of unpolarized pixels of the non-specific color, pixel signals of polarized pixels of the non-specific color, and an azimuth angle of the specific color is equal to an azimuth angle of the non-specific color, wherein
the non-specific color is different from the non-specific color, and
the polarized pixels of the non-specific color have fewer polarization directions than polarized pixels of the specific color.

14. A non-transitory computer-readable medium having stored thereon, computer-executable instructions, which when executed by a computer, cause the computer to execute operations, the operations comprising:
detecting polarization properties of a non-specific color based on polarization properties of a specific color, pixel signals of unpolarized pixels of the non-specific color, pixel signals of polarized pixels of the non-specific color, and an azimuth angle of the specific color is equal to an azimuth angle of the non-specific color, wherein
the non-specific color is different from the specific color, and
the polarized pixels of the non-specific color have fewer polarization directions than polarized pixels of the specific color.

15. A solid-state imaging apparatus, comprising:
pixels of a specific color configured to enable polarization properties of the specific color; and
pixels of a non-specific color configured to detect polarization properties of the non-specific color, wherein
the non-specific color is different from the specific color, and
the pixels of the non-specific color comprise: unpolarized pixels of the non-specific color; and
polarized pixels of the non-specific color having fewer polarization directions than polarized pixels of the specific color;
a first scanning circuit configured to:
generate a reset signal for each polarized pixel of a plurality of polarized pixels and each unpolarized pixel of a plurality of unpolarized pixels;
control a first exposure period for each polarized pixel of the plurality of polarized pixels and a second exposure period for each unpolarized pixel of the plurality of unpolarized pixels based on the generated reset signal, wherein the second exposure period is shorter than the first exposure period;
generate a first pixel signal for each polarized pixel of the plurality of polarized pixels based on the first exposure period; and
generate a second pixel signal for each unpolarized pixel of the plurality of unpolarized pixels based on the second exposure period, wherein the first pixel signal has same sensitivity as the second pixel signal.

16. The solid-state imaging apparatus according to claim 15, wherein
the pixels of the specific color comprise unpolarized pixels of the specific color and the polarized pixels of the specific color having at least two polarization directions, and the pixels of the non-specific color further comprise the polarized pixels of the non-specific color having one polarization direction.

17. The solid-state imaging apparatus according to claim 16, wherein
a pixel array repeat unit includes pixels of the specific color and pixels of the non-specific color,
the pixels of the non-specific color comprise the unpolarized pixels of the non-specific color and the polarized pixels of the non-specific color having one polarization direction, and
the pixels of the specific color include the unpolarized pixels of the specific color and the polarized pixels of the specific color having at least two polarization directions.

18. The solid-state imaging apparatus according to claim 15, further comprising a second scanning circuit, wherein the first scanning circuit and the second scanning circuit is configured to interpolatively read out signals of pixels having a same color and a same polarization direction.

* * * * *